(12) United States Patent
Fudaba et al.

(10) Patent No.: US 8,489,037 B2
(45) Date of Patent: Jul. 16, 2013

(54) POWER AMPLIFYING APPARATUS WITH BANDWIDTH LIMITATION PROCESSING ON VARIABLE POWER SUPPLY

(75) Inventors: Nobukazu Fudaba, Kawasaki (JP); Hiroyoshi Ishikawa, Kawasaki (JP); Hajime Hamada, Kawasaki (JP); Yuichi Utsunomiya, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 394 days.

(21) Appl. No.: 12/328,950

(22) Filed: Dec. 5, 2008

(65) Prior Publication Data

US 2009/0191923 A1   Jul. 30, 2009

(30) Foreign Application Priority Data

Jan. 25, 2008   (JP) ................... 2008-015592

(51) Int. Cl.
*H04B 1/66* (2006.01)
(52) U.S. Cl.
USPC ......... 455/102; 455/108; 455/110; 455/127.1
(58) Field of Classification Search
USPC ................. 455/102, 108, 110, 127.1
See application file for complete search history.

(56) References Cited

U.S. PATENT DOCUMENTS

| | | | | |
|---|---|---|---|---|
| 6,138,042 A * | 10/2000 | Midya et al. | ................ | 455/571 |
| 6,141,541 A * | 10/2000 | Midya et al. | .................... | 455/91 |
| 6,256,482 B1 * | 7/2001 | Raab | ............................. | 455/108 |
| 7,395,039 B2 * | 7/2008 | Akizuki et al. | ............ | 455/127.2 |
| 7,519,336 B2 * | 4/2009 | Vepsalainen et al. | ...... | 455/127.1 |
| 7,525,377 B2 * | 4/2009 | Altham et al. | ................ | 330/136 |
| 7,881,683 B2 * | 2/2011 | Hellberg et al. | ........... | 455/127.1 |
| 7,970,364 B2 * | 6/2011 | Mayer et al. | ................ | 455/127.2 |
| 2002/0193085 A1 * | 12/2002 | Mathe et al. | .................. | 455/126 |
| 2004/0198258 A1 | 10/2004 | Tanaka et al. | | |
| 2004/0208262 A1 | 10/2004 | Midya et al. | | |
| 2006/0028271 A1 | 2/2006 | Wilson | | |
| 2007/0013567 A1 | 1/2007 | Matsuura et al. | | |
| 2007/0290742 A1 | 12/2007 | Altham et al. | | |
| 2007/0297530 A1 | 12/2007 | Maeda et al. | | |
| 2008/0146171 A1 | 6/2008 | Hellberg et al. | | |

FOREIGN PATENT DOCUMENTS

| | | |
|---|---|---|
| CN | 101061632 | 10/2007 |
| CN | 101088214 | 12/2007 |
| JP | 5-136830 | 6/1993 |
| JP | 7-283657 | 10/1995 |
| JP | 2002-522946 | 7/2002 |

(Continued)

OTHER PUBLICATIONS

Korean Notice of Preliminary Rejection dated Feb. 22, 2011 from corresponding Korean Application No. 10-2008-134555.
Korean Notice of Preliminary Rejection dated Jun. 28, 2010, from the corresponding Korean Application.

(Continued)

*Primary Examiner* — Kenneth B. Wells
(74) *Attorney, Agent, or Firm* — Katten Muchin Rosenman LLP

(57) ABSTRACT

A power amplifying apparatus has a bandwidth limitation process circuit to which an envelope signal included in a transmission signal is inputted, and which performs a bandwidth limitation process on the envelope signal, a variable power supply circuit for generating a power amplifier supply voltage based on a voltage control signal generated by the bandwidth limitation process circuit, and a power amplifier which is fed an input signal, and which is driven in accordance with the supply voltage from the variable power supply circuit.

13 Claims, 28 Drawing Sheets

FOREIGN PATENT DOCUMENTS

| | | |
|---|---|---|
| JP | 2004-320735 | 11/2004 |
| JP | 2006-514472 | 4/2006 |
| WO | 00/08774 | 2/2000 |
| WO | 2007/004518 | 1/2007 |
| WO | 2007/148753 | 12/2007 |

OTHER PUBLICATIONS

Partial translation of Notification of Reasons for Refusal dated Aug. 30, 2011, from corresponding Japanese Application No. 2008-015592.

* cited by examiner

FIG. 17

COEFFICIENT SELECTION CONDITION TABLE

| CONDITION | COEFFICIENT SELECTION |
|---|---|
| $Pr(R) < K_1$ | COEFFICIENT 1 |
| $K_1 \leqq Pr(R) < K_2$ | COEFFICIENT 2 |
| $K_2 \leqq Pr(R)$ | COEFFICIENT 3 |

FIG. 28

THRESHOLD VALUE SELECTION CONDITION TABLE

| CONDITION | THRESHOLD VALUE SELECTION |
|---|---|
| $Pr(R) < K_1$ | $P_{th1}$ |
| $K_1 \leq Pr(R) < K_2$ | $P_{th2}$ |
| $K_2 \leq Pr(R)$ | $P_{th3}$ |

POWER AMPLIFYING APPARATUS WITH BANDWIDTH LIMITATION PROCESSING ON VARIABLE POWER SUPPLY

CROSS-REFERENCE TO RELATED APPLICATION

This application is based upon and claims the benefit of priority of the prior Japanese Patent Application No. 2008-15592, filed on Jan. 25, 2008, the entire contents of which are incorporated herein by reference.

FIELD

The present invention relates to a technique for increasing the efficiency of a power amplifier used in a transmission section of a mobile terminal device or a wireless base station, for example.

BACKGROUND

In recent years, with the deficiency of radio frequency bands and the increase in communication speed, a modulation system having a high frequency utilization efficiency has been employed, and/or the bandwidth of a transmission signal has been widened. Under these current circumstances, in order to minimize the degradation in signal quality, a power amplifier having a high linearity is preferably used in a transmission section for mobile communication, for example. However, the linearity of an amplifier and power efficiency run counter to each other; therefore, if a wide-band signal is subjected to linear amplification, the power efficiency is reduced, and power consumption increase and/or measures for heat dissipation, for example, will cause problems.

As solutions to the above-mentioned problems, there have been proposed an EER (Envelope Elimination and Restoration) system and an ET (Envelope Tracking) system for controlling a drain voltage or a collector voltage for a power amplifier in accordance with envelope variation of a transmission signal. For example, in the ET system, a drain voltage or a collector voltage supplied to a power amplifier for amplifying a transmission signal is controlled in accordance with envelope information of the transmission signal, thereby increasing the power efficiency.

FIG. 1 illustrates a configuration example of a power amplifying apparatus in which the above-mentioned ET system is used, and the power amplifying apparatus includes: an envelope extraction section 30; a variable power supply section 31; a power amplifier 32; and a delay circuit 33. The envelope extraction section 30 extracts envelope information of a transmission signal, and supplies a voltage control signal to the variable power supply section 31 via a digital-to-analog (D/A) conversion circuit 34. The variable power supply section 31 generates, based on a signal inputted thereto, a drain voltage for the power amplifier 32, and supplies the drain voltage to the power amplifier 32. The transmission signal is delayed for a predetermined period of time by the delay circuit 33, sent to an up-converter 36 via a digital-to-analog (D/A) conversion circuit 35, converted into a carrier frequency signal by the up-converter 36, and amplified as an amplifier input signal by the power amplifier 32.

Japanese Laid-open Patent Application Publication No. 05-136830 discloses an invention in which a drain voltage supplied to an FET element serving as a power amplifier is controlled so as to be compatible with the FET element whose characteristics are varied depending on temperature. Further, Japanese translation of PCT international application No. 2002-522946 discloses an invention in which the maximum peak factor of a transmission signal during a predetermined period is determined, and a voltage supplied to a power amplifier is controlled in accordance with the determined peak factor.

However, even in a power amplifying apparatus in which the above-mentioned ET system is used, as the bandwidth of a transmission signal is widened, the bandwidth of an envelope signal thereof is also widened, which makes it difficult to realize high-speed response of a power supply. Therefore, with the aim of following the average envelope variation instead of following an instantaneous envelope variation, there has been proposed a voltage control method that uses a high-efficiency power supply such as a switching power supply.

FIG. 2 illustrates an example of a power amplifying circuit for performing such a voltage control method. The power amplifying circuit limits the bandwidth of an envelope signal, which is varied at a high speed, by a low-pass filter (LPF) 37, converts the envelope signal into a signal whose variation speed is slow, and supplies a drain voltage to a power amplifier 32 via a variable power supply section 31.

However, the bandwidth limitation performed using the low-pass filter 37 is influenced by previous and subsequent envelope amplitudes; therefore, as illustrated in FIG. 3, a voltage different from an optimal voltage at a peak of the envelope signal is applied to a drain of the power amplifier 32. For example, with respect to the peak position of an envelope signal I within a circle indicated by the dotted line in FIG. 3, the peak position of an output signal II passed through the low-pass filter 37 is largely deviated.

At the peak of the envelope signal, an input signal to the power amplifier 32 is instantaneously increased, thus significantly contributing to the efficiency of the power amplifier 32. Accordingly, for example, when a voltage higher than an optimal voltage at the peak of the envelope signal I is applied, redundant power is supplied from a power supply, and the power efficiency is reduced. On the other hand, when a voltage lower than an optimal voltage at the peak of the envelope signal I is applied to the power amplifier 32, the amplification factor is reduced, and non-linear distortion is increased.

SUMMARY

In view of the above-described circumstances, embodiments discussed herein provide a power amplifying apparatus and a power amplifier supply voltage control method, which perform, when the speed of an envelope signal is decreased to generate a voltage control signal, control to make the peak of the envelope signal coincide with that of the voltage control signal so that a voltage supplied to the power amplifier 32 in accordance with the peak of the envelope signal becomes an optimal voltage, thus enabling improvement of power efficiency.

According to an aspect of the embodiments, a power amplifying apparatus has a bandwidth limitation process circuit to which an envelope signal of a transmission signal is inputted, and which performs a bandwidth limitation process on the envelope signal, a variable power supply circuit for generating a power amplifier supply voltage based on a voltage control signal generated by the bandwidth limitation process circuit, and a power amplifier which is fed the input signal, and which is driven in accordance with the supply voltage from the variable power supply circuit.

And according to another aspect of the embodiments, a power amplifier supply voltage control method for controlling a voltage supplied to a power amplifier in accordance with an envelope variation of a transmission signal performs, when a voltage control signal supplied to a variable power supply circuit is generated from an envelope signal generated based on the transmission signal, a bandwidth limitation process for making a peak point of the voltage control signal coincide with a peak point of the envelope signal.

Additional objects and advantages of the embodiment will be set forth in part in the description which follows, and in part will be obvious from the description, or may be learned by practice of the embodiment. The object and advantages of the embodiment will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 17 is a diagram illustrating an example of a coefficient selection table.

FIG. 28 is a diagram illustrating an example of a threshold value selection condition table.

DESCRIPTION OF EMBODIMENTS

Hereinafter, embodiments of the present invention will be described based on the drawings. As would be understood by one skilled in the art, the terms "section" and "circuit" may be used interchangeably in describing the embodiments of the invention.

Embodiment 1

Figure 1:
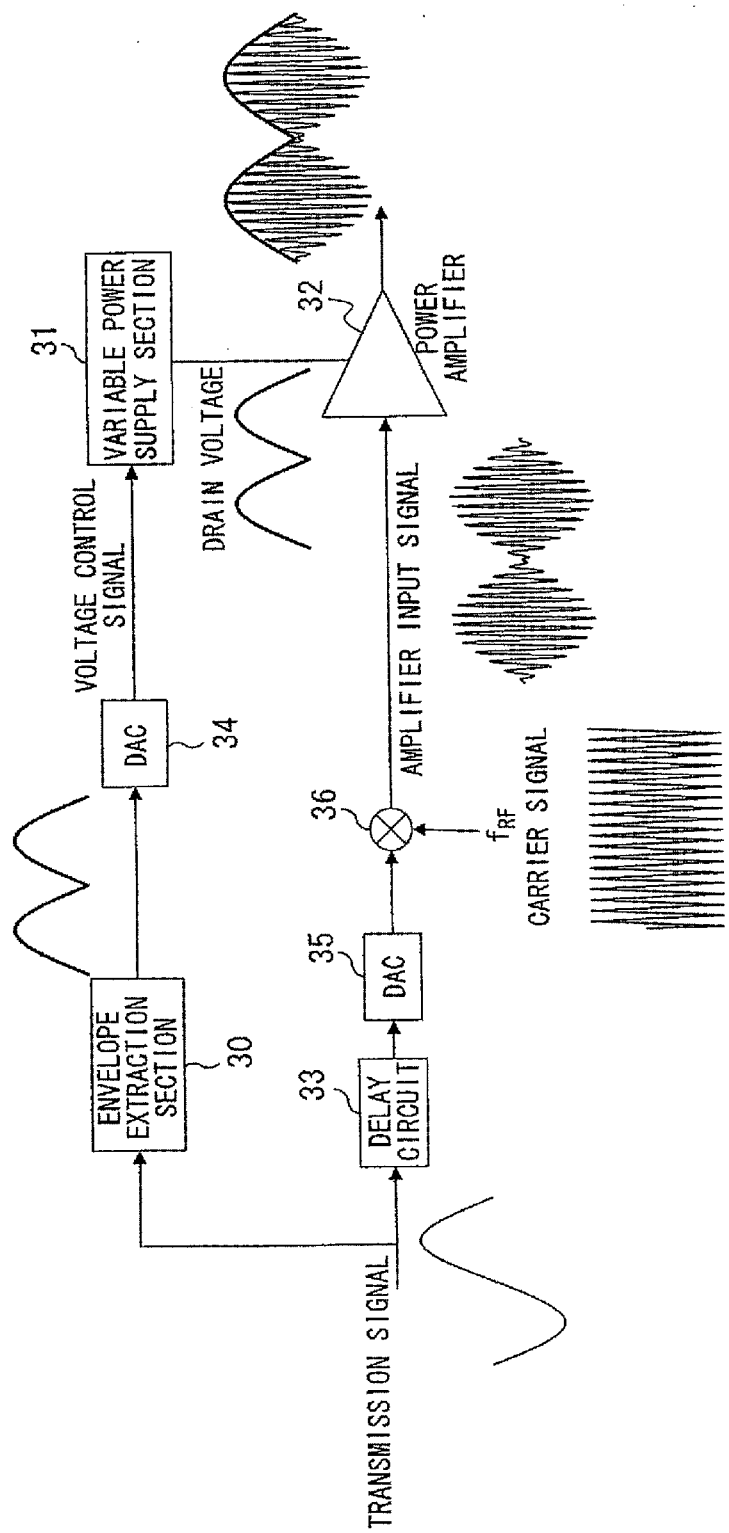
FIG. 1 is a diagram illustrating a configuration example of a power amplifying apparatus in which an ET system is used.
Figure 2:
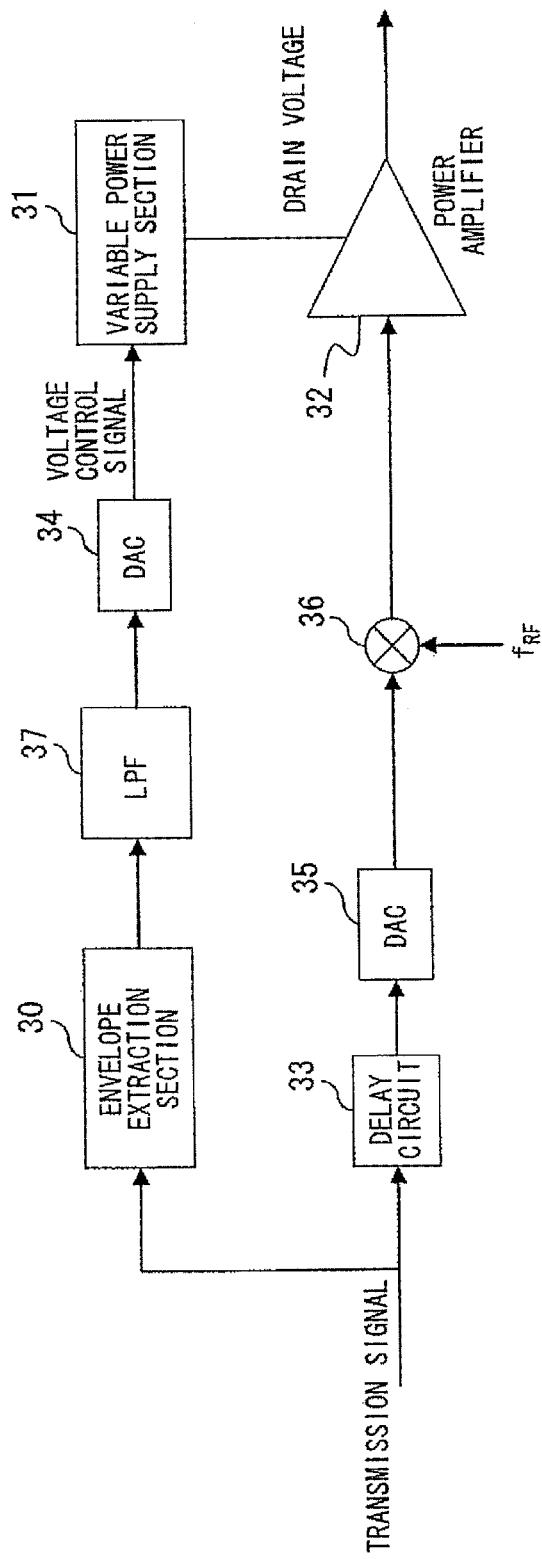
FIG. 2 is a diagram illustrating a conventional example of a power amplifying circuit for performing a voltage control method.
Figure 3:
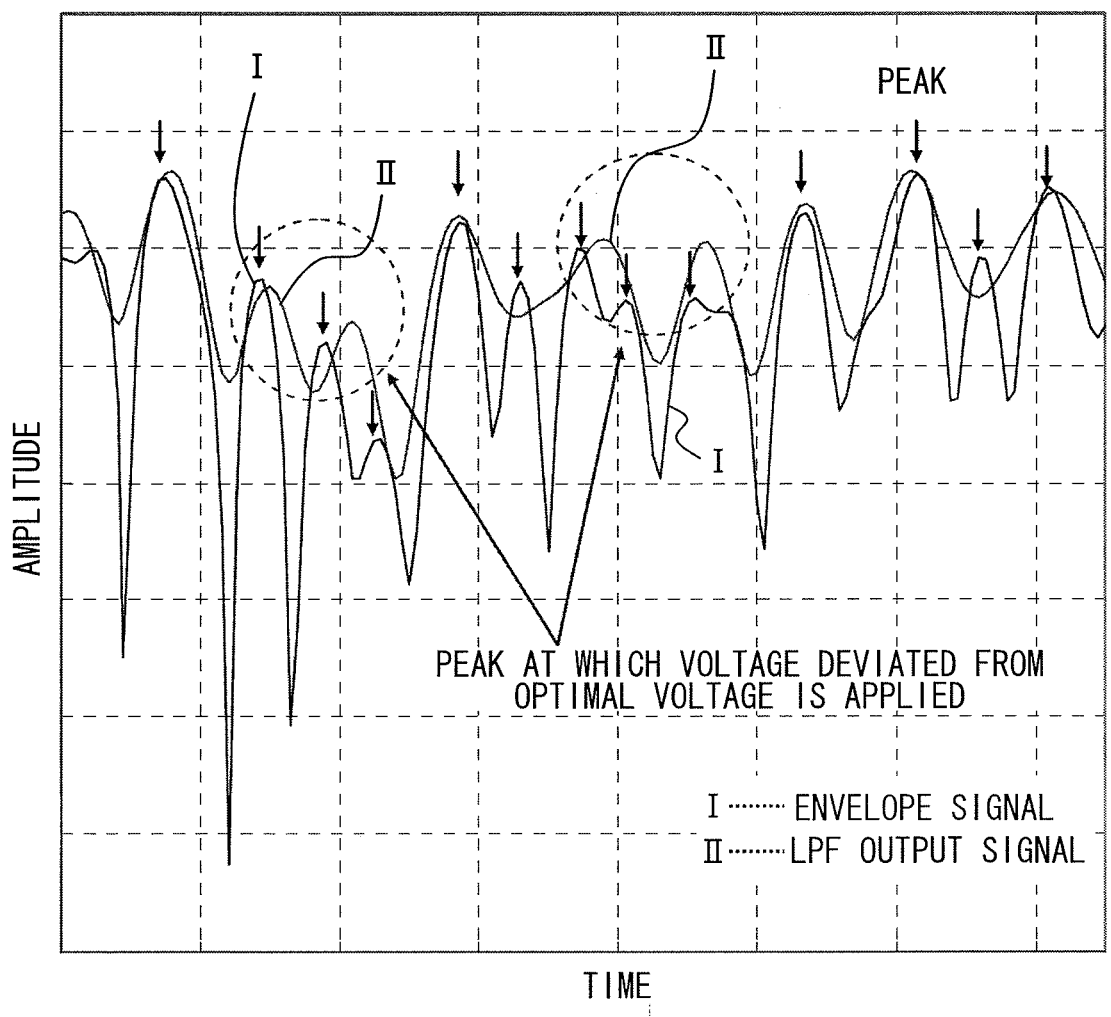
FIG. 3 is a graph for describing problems of the conventional example.
Figure 4:
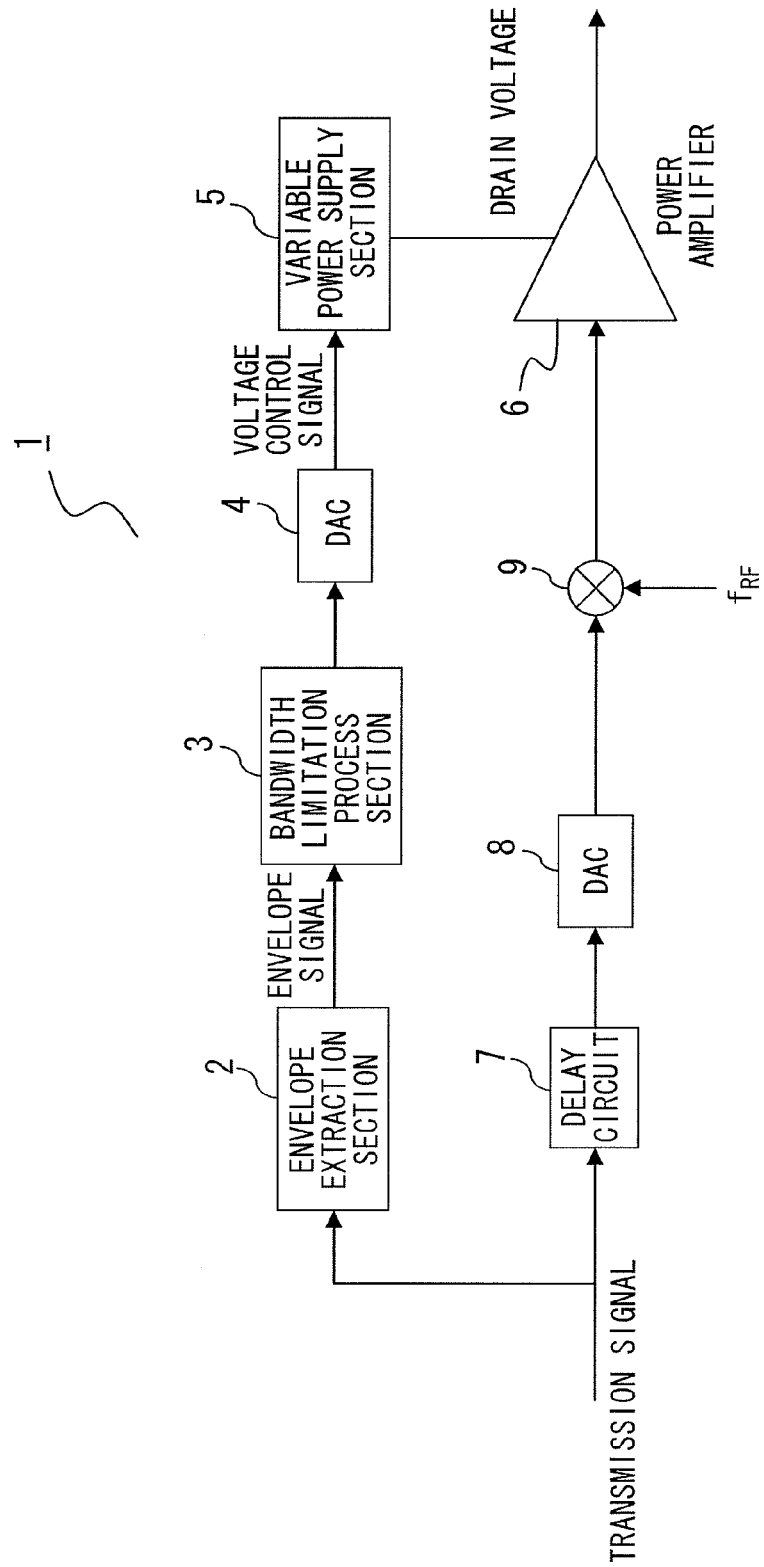
FIG. 4 is a circuit diagram of a power amplifying apparatus of Embodiment 1.

FIG. 4 is a circuit diagram of a power amplifying apparatus of the present embodiment.

Referring to FIG. 4, a power amplifying apparatus 1 includes: an envelope extraction section 2; a bandwidth limitation process section (bandwidth limitation process circuit) 3; a digital-to-analog (hereinafter, denoted as "D/A") conversion circuit 4; a variable power supply section (variable power supply circuit) 5; a power amplifier 6; a delay circuit 7; a D/A conversion circuit 8; and an up-converter 9. The power amplifying apparatus 1 of this embodiment is used in a transmission section of a mobile terminal device such as a cellular phone and/or a wireless base station, for example, and audio information or the like is included in a transmission signal.

The envelope extraction section 2 extracts an envelope component contained in a transmission signal, and outputs an envelope signal to the bandwidth limitation process section 3. The bandwidth limitation process section 3 performs an aftermentioned window function process, for example, and sends a voltage control signal to the variable power supply section 5 via the D/A conversion circuit 4, and then the variable power supply section 5 generates a drain voltage, and outputs the drain voltage to the power amplifier 6. At this time, a carrier frequency fRF is superimposed on the transmission signal by the up-converter 9, and the transmission signal is amplified in the power amplifier 6 by an optimal drain voltage supplied from the variable power supply section 5, and is outputted to the outside. A window function serves to make the peak of the voltage control signal coincide with that of the envelope signal, thus making the peak of the transmission signal coincide with that of the drain voltage in the power amplifier 6.

Figure 5:
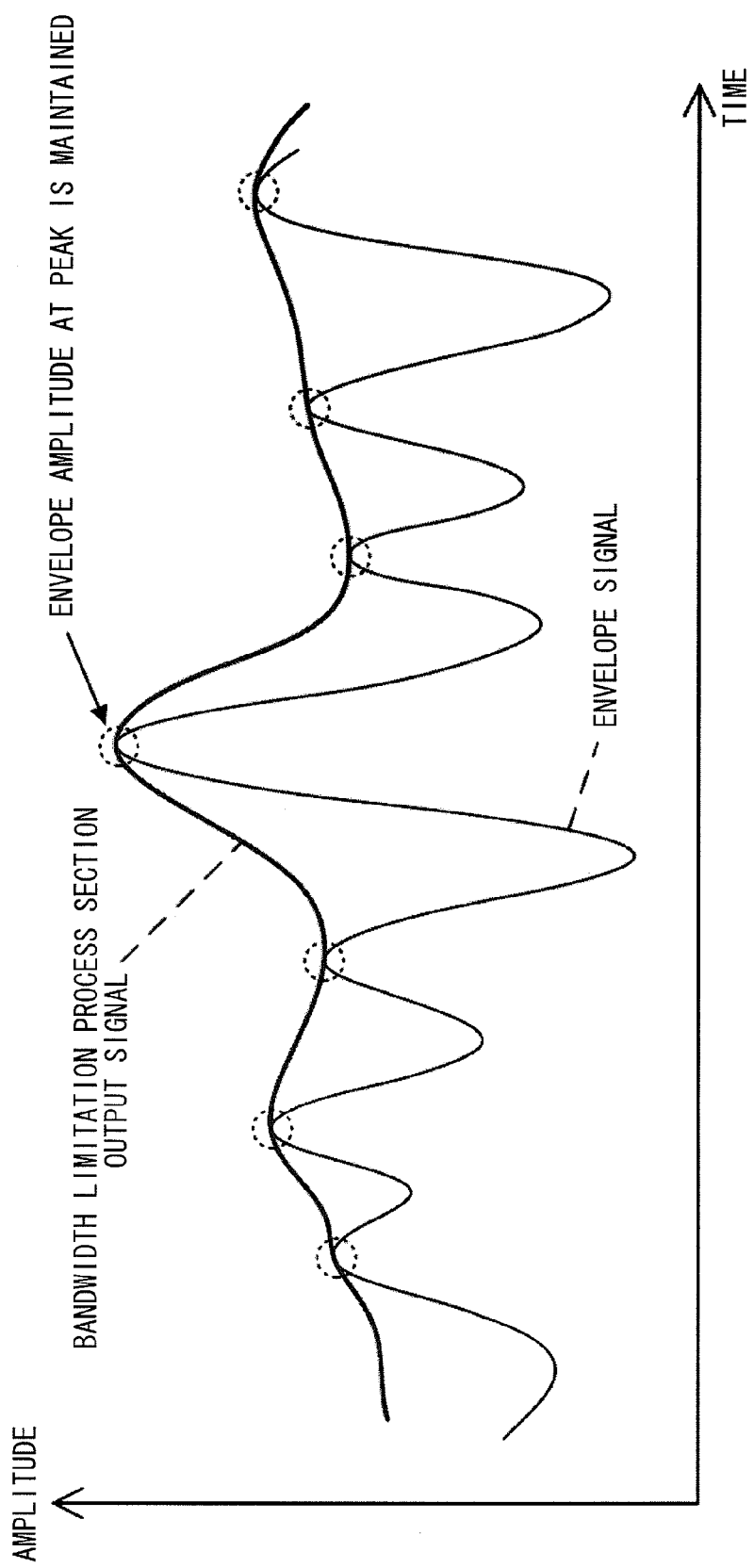
FIG. 5 is a graph illustrating the relationship between an envelope signal and an output signal of a bandwidth limitation process section.

FIG. 5 is a graph illustrating the relationship between the envelope signal and the output signal of the bandwidth limitation process section 3. In the present embodiment, waveforms are generated so that the waveform of the output signal of the bandwidth limitation process section 3 infallibly passes through the peaks of the envelope signal. Accordingly, in the present embodiment, when the speed of the envelope signal is decreased, the signal, whose speed has been decreased by the bandwidth limitation process section 3, passes through a peak value of the original envelope signal, and an optimal drain voltage is generated by a voltage control signal whose speed has been decreased while an amplitude value corresponding to the peak value is maintained, thus driving the power amplifier 6. Consequently, in the present embodiment, the power efficiency can be improved.

In the following embodiment, a specific configuration of the bandwidth limitation process section 3 will be described.

Embodiment 2

Next, Embodiment 2 will be described.

Figure 6:
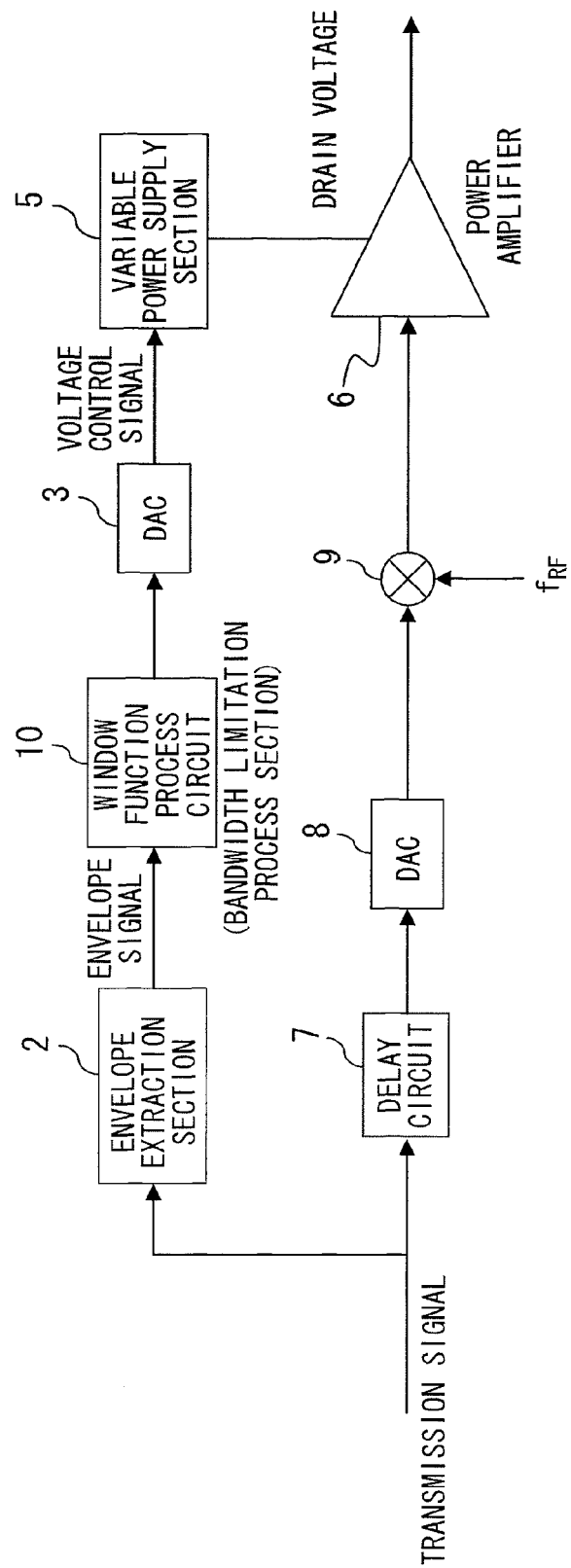
FIG. 6 is a circuit diagram for describing Embodiment 2.

FIG. 6 is a circuit diagram for describing the present embodiment, and in particular, FIG. 6 is a diagram illustrating a circuit configuration of the power amplifying apparatus including a specific configuration of the bandwidth limitation process section 3. The circuit configuration illustrated in FIG. 6 is similar to that described above and illustrated in FIG. 4 except for the bandwidth limitation process section 3, and therefore, the description of the circuit configuration other than the bandwidth limitation process section 3 will be omitted.

Figure 7:
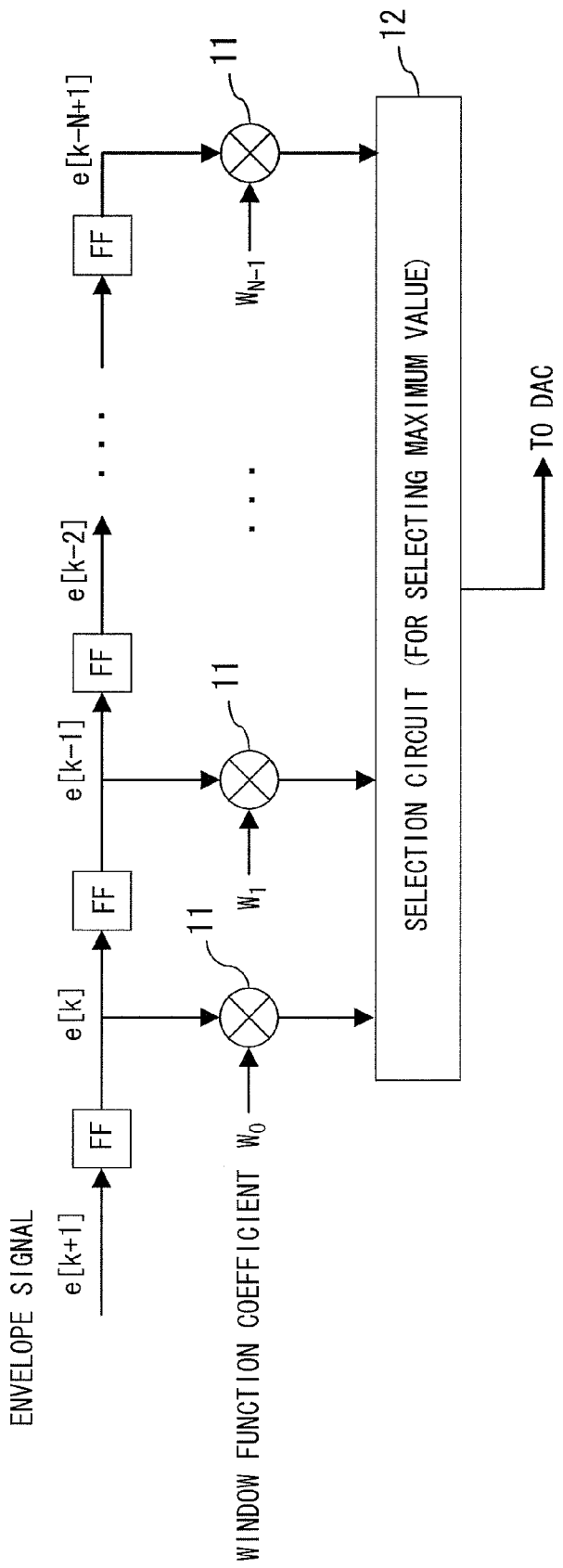
FIG. 7 is a diagram for describing a specific circuit configuration of a window function process section.

In the present embodiment, a window function process circuit 10 is used as the bandwidth limitation process section 3. FIG. 7 is a circuit diagram of the window function process circuit 10. The window function process circuit 10 includes: flip-flops (FF); window function coefficient multiplication sections 11; and a selection circuit 12 for selecting the maximum value. The envelope signal extracted by the envelope extraction section 2 is inputted to each flip-flop (FF) in synchronization with a clock signal; for example, an envelope signal $e[k-m]$ ($m=0, 1, \ldots N-1$) for the maximum N−1 clock from a certain time k is retained in each flip-flop (FF). The multiplication sections 11 each multiply an output of the associated flip-flop (FF) by a window function coefficient $Wm$ ($m=0, 1, \ldots N-1$), and supply the multiplied result to the selection circuit 12. The selection circuit 12 selects the maximum value from among an N number of the multiplied results, and outputs the maximum value to the D/A conversion circuit 4.

Figure 8:
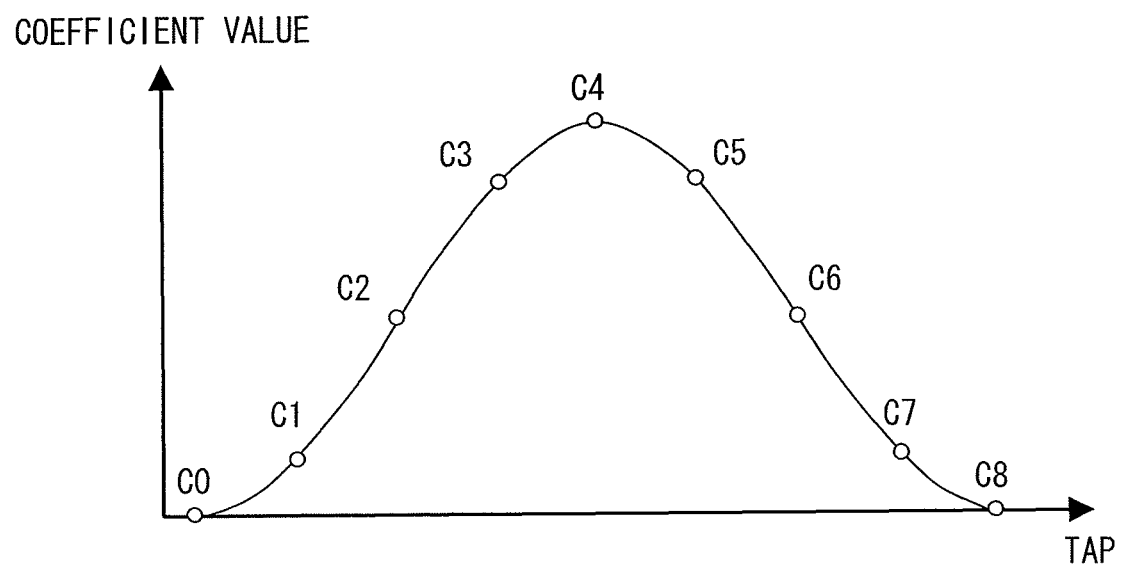
FIG. 8 is a graph illustrating an example of a window function coefficient with which a multiplication process is performed by a window function coefficient multiplication section.

FIG. 8 is a graph illustrating an example of a window function coefficient with which a multiplication process is performed by the window function coefficient multiplication sections 11. In the example illustrated in FIG. 8, a window function coefficient for 9 taps (C0 to C8) is used to process an envelope signal, and the speed of the envelope signal is decreased while the peak portion of the envelope value is maintained.

Figure 9:
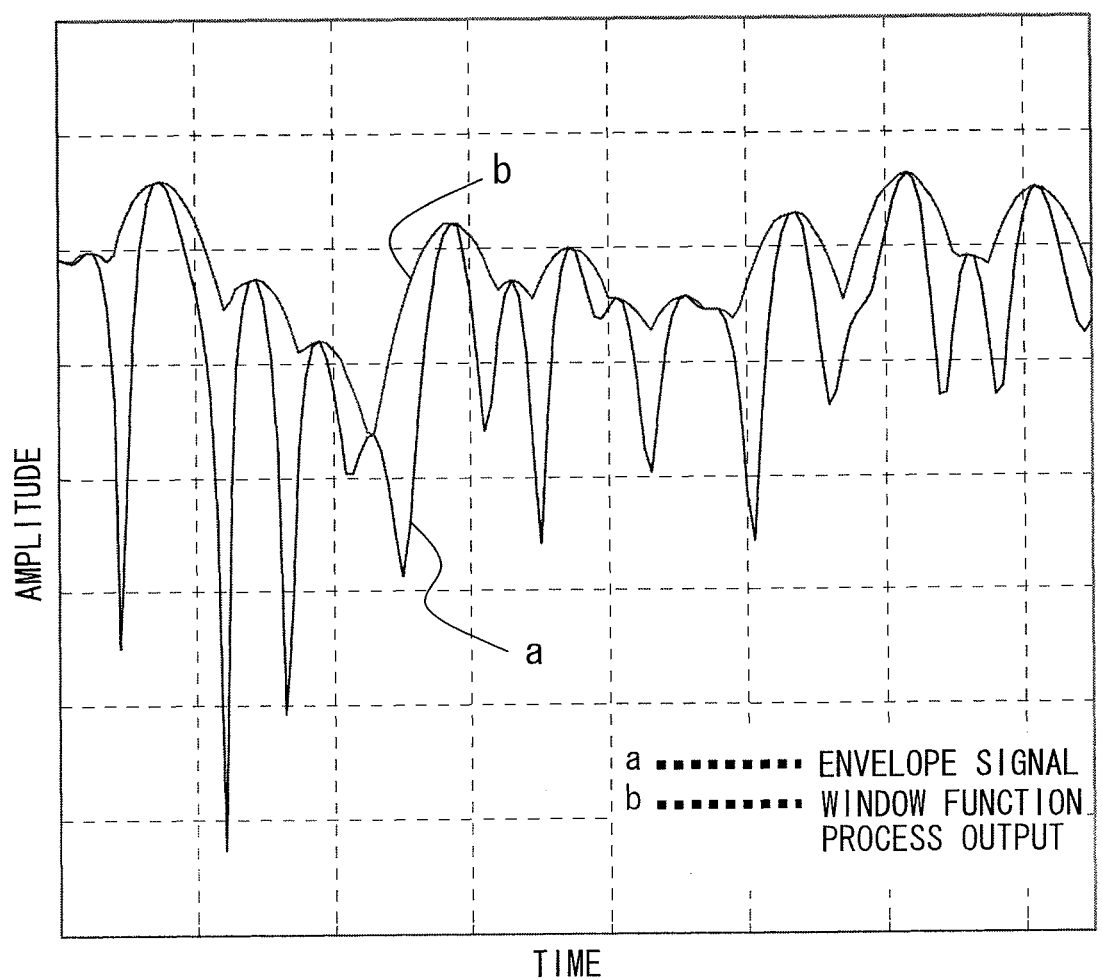
FIG. 9 is a graph illustrating process results of the window function process section in the case of using a window function coefficient.

FIG. 9 is a graph illustrating process results of the window function process section 10 in the case of using the above-described window function coefficient. An envelope signal indicated by a in FIG. 9 has a waveform indicated by b in FIG. 9 due to the process performed by the window function process circuit 10, and is supplied to the variable power supply section 5. In other words, even in the case of an envelope signal whose speed has been decreased, the window function process circuit 10 retains an envelope value at the peak of the original envelope signal, and outputs an output signal corresponding to the peak of the envelope signal to the variable power supply section 5. Thus, the variable power supply section 5 can generate an optimal drain voltage and supply the optimal drain voltage to the power amplifier 6.

Consequently, according to the present embodiment, the optimal drain voltage can be supplied to the power amplifier 6 in accordance with the peak of the envelope signal, thus enabling improvement in the power efficiency.

Embodiment 3

Next, Embodiment 3 will be described.

Figure 10:
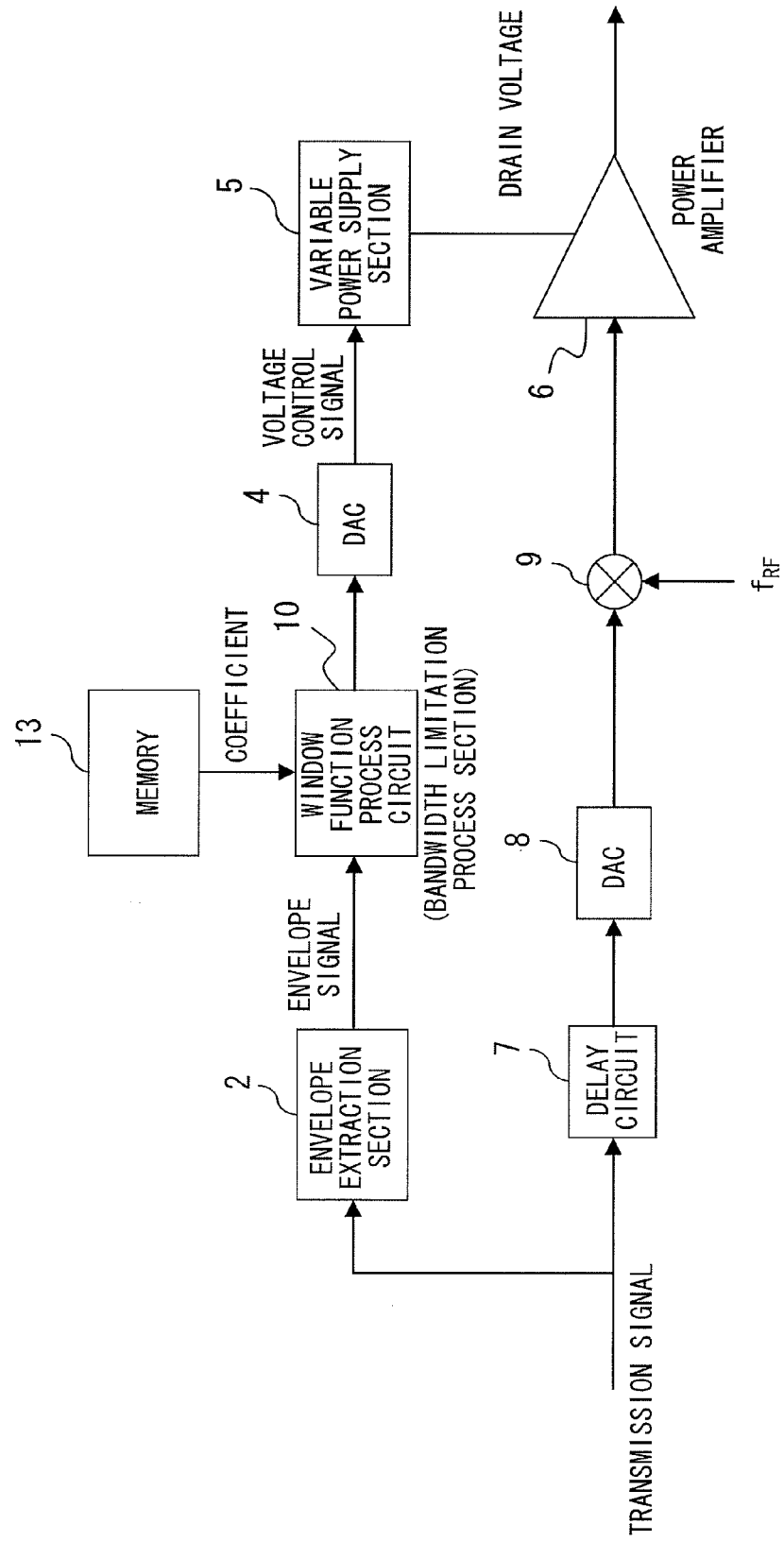
FIG. 10 is a circuit diagram for describing Embodiment 3.

FIG. 10 is a circuit diagram for describing the present embodiment. In particular, in the present embodiment, a plurality of window function coefficients with different number of taps are registered in a memory 13, and an optimal window function coefficient is supplied to the window function process circuit 10 to generate a voltage control signal. The circuit configuration illustrated in FIG. 10 is similar to that described above and illustrated in FIG. 6 except for the memory 13, and therefore, the description of the circuit configuration other than the memory 13 will be omitted.

As described above and illustrated in FIG. 7, the window function process circuit 10 includes: flip-flops (FF); window function coefficient multiplication sections 11; and a selection circuit 12 for selecting the maximum value. An optimal window function coefficient is selected from among different window function coefficients registered in advance in the memory 13 for an N samples of the envelope signal supplied to the flip-flops (FF), thus decreasing the speed of envelope signal. In other words, the window function process circuit 10 selects a coefficient from among a plurality of window function coefficients to generate a voltage control signal, and supplies a drive voltage more corresponding to the characteristics of the transmission signal to the power amplifier 6.

Figure 11:
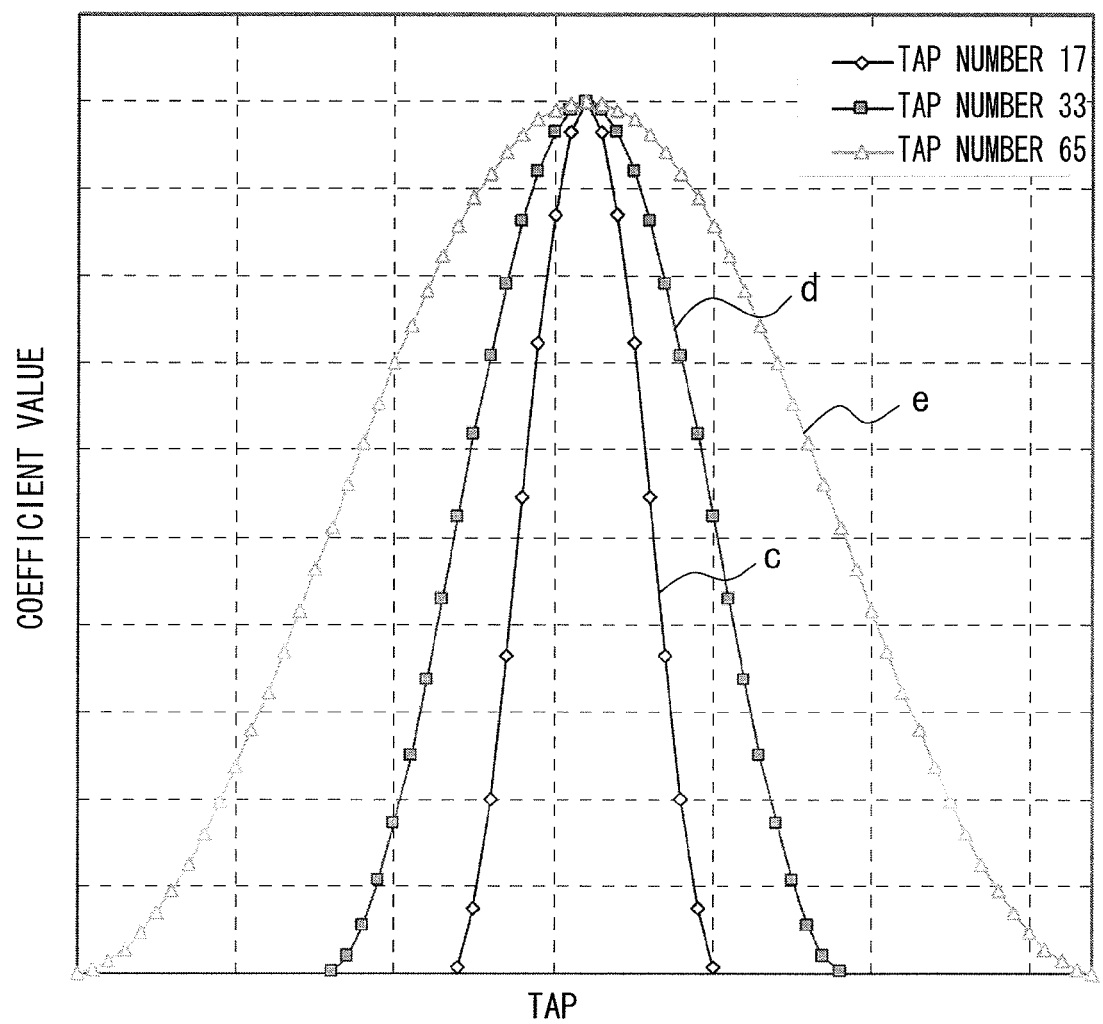
FIG. 11 is a graph illustrating examples of a plurality of window function coefficients with different number of taps registered in a memory.
Figure 12:
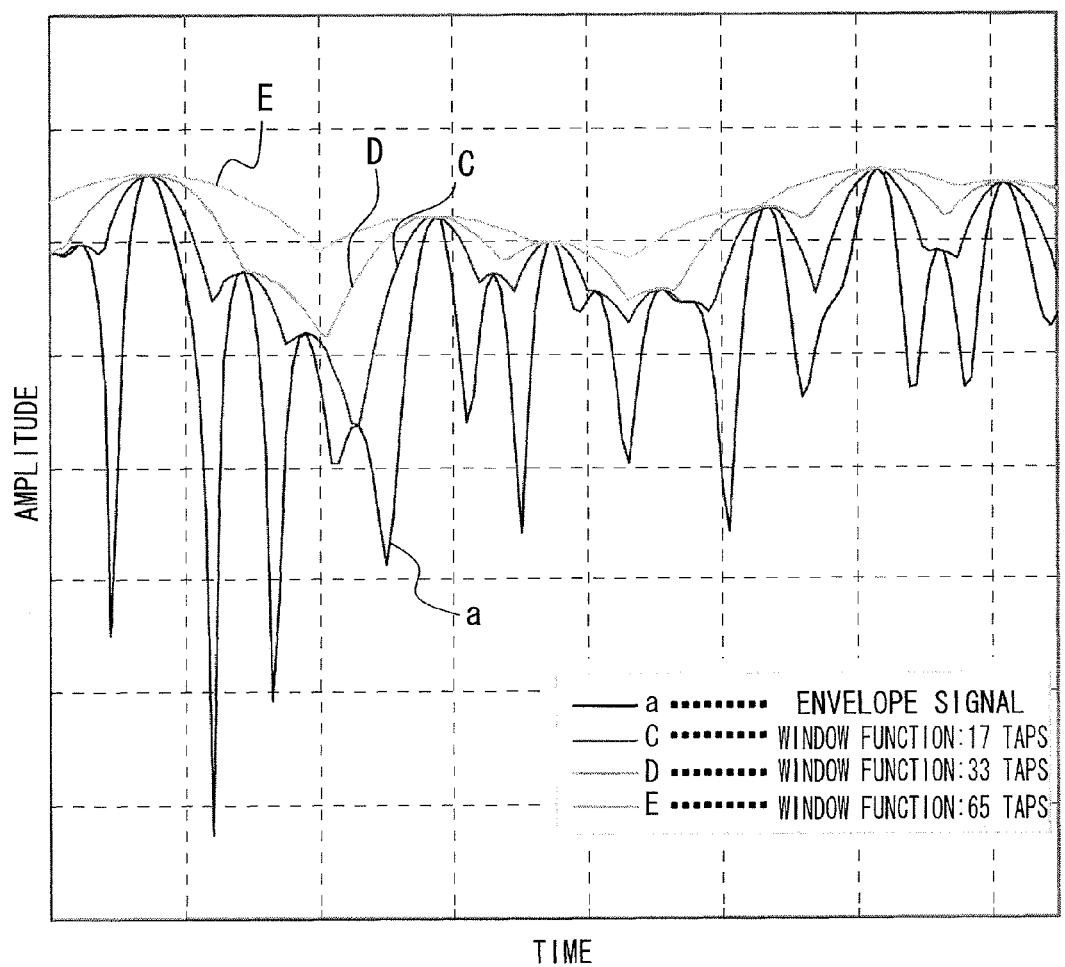
FIG. 12 is a graph illustrating an example in which the speed of an envelope signal is decreased using window function coefficients c to e.

Now, FIG. 11 is a graph illustrating examples of a plurality of window function coefficients with different number of taps registered in the memory 13. For example, as illustrated in FIG. 11, an example of a window function coefficient with 17 taps is indicated by c, an example of a window function coefficient with 33 taps is indicated by d, and an example of a window function coefficient with 65 taps is indicated by e. Further, FIG. 12 is a graph illustrating results of a process performed by the window function process circuit 10 in accordance with the above-described window function coefficients. In FIG. 12, C represents an output waveform when the window function coefficient with 17 taps is selected, D represents an output waveform when the window function coefficient with 33 taps is selected, and E represents an output waveform when the window function coefficient with 65 taps is selected. The above-mentioned output waveforms will each be a waveform having a peak at a peak position of an envelope signal a.

Furthermore, the window function coefficients registered in the memory 13 may be changed in accordance with the characteristics of a transmission signal and/or use situation of a mobile terminal device, for example. Accordingly, in the present embodiment, the window function coefficients are not fixed, but can be flexibly changed in accordance with the above-mentioned conditions, thus enabling improvement in the power efficiency for a wide variety of power amplifiers.

Figure 13:
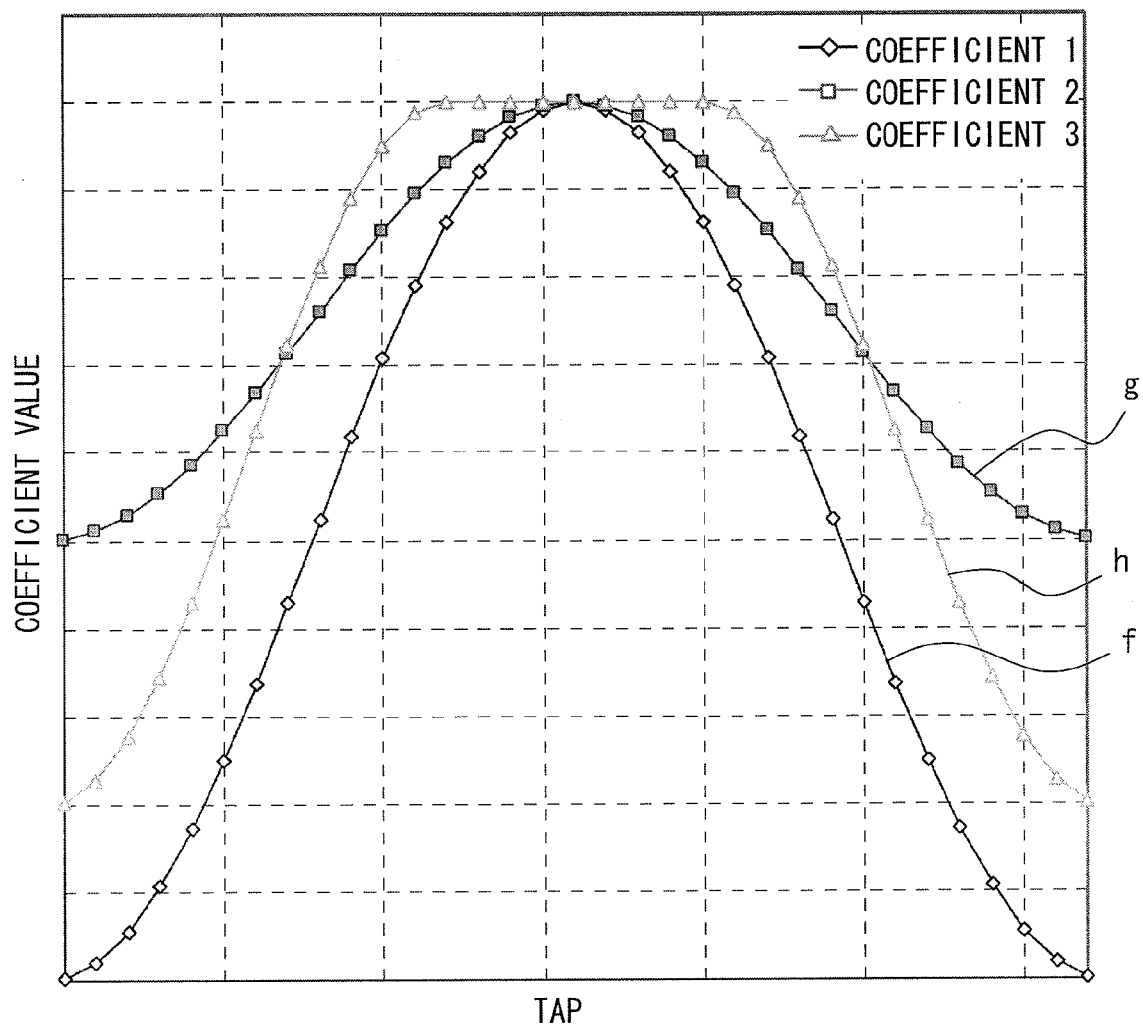
FIG. 13 is a graph illustrating examples of a plurality of window function coefficients with different shapes registered in a memory.

FIG. 13 illustrates examples of a plurality of window function coefficients with the same number of taps but with different shapes, which are registered in the memory 13. In this case, as illustrated in FIG. 13, f represents an example of a window function (coefficient 1) having a shape substantially similar to that of the window function illustrated in FIG. 11, g represents an example of a window function (coefficient 2) having a shape more slightly curved than the window function f, and h represents an example of a window function (coefficient 3) having a shape that is further slightly curved and is flat in the vicinity of the peak.

Figure 14:
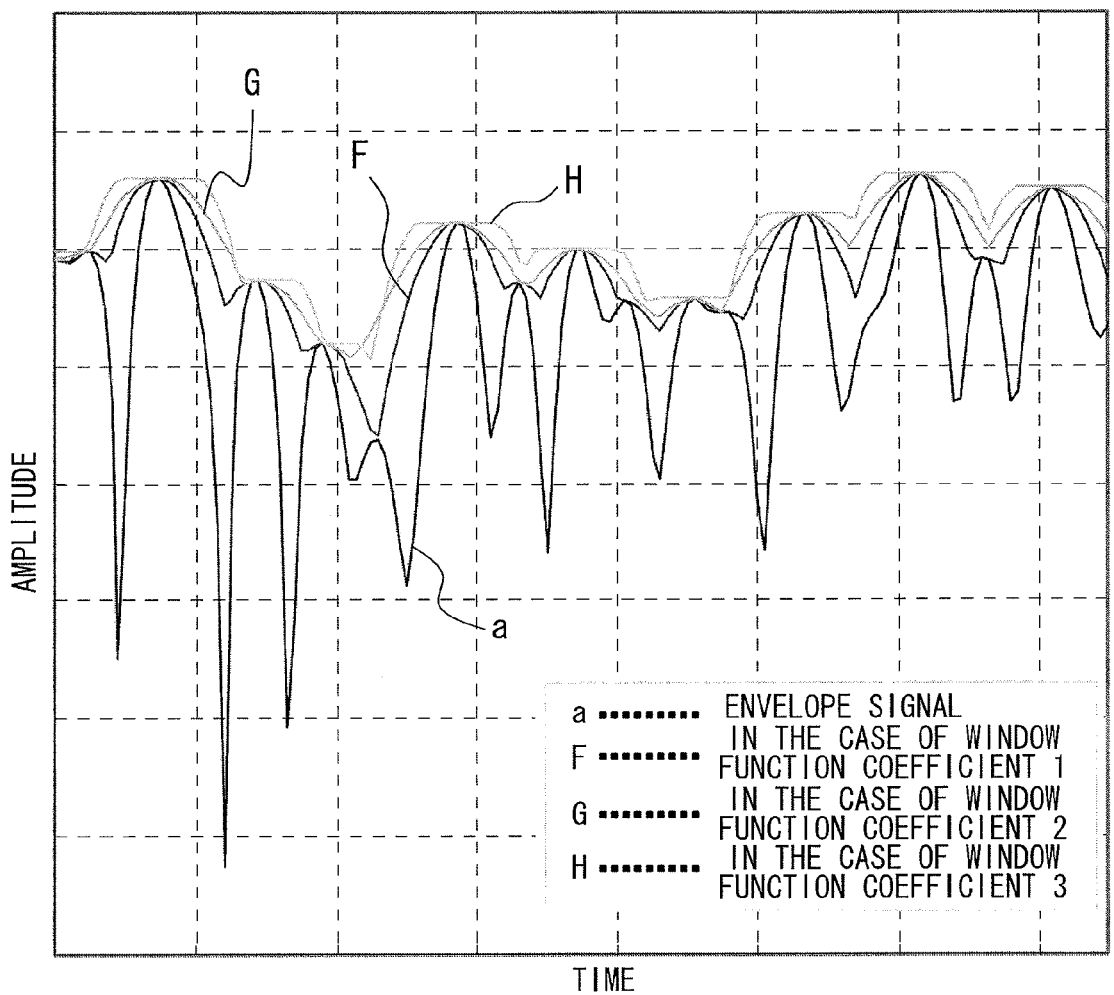
FIG. 14 is a graph illustrating an example in which the speed of an envelope signal is decreased using window function coefficients f to h.

FIG. 14 illustrates an example in which the speed of an envelope signal is decreased using the above-described window function coefficients f to h, and is a diagram illustrating comparisons between signal waveforms outputted from the window function process circuit 10 and the waveform of the original envelope signal a. In FIG. 14, F represents an output waveform when a window function coefficient of the coefficient 1 is selected, G represents an output waveform when a window function coefficient of the coefficient 2 is selected, and H represents an output waveform when a window function coefficient of the coefficient 3 is selected. Also in this case, the output waveforms will each be a waveform having a peak at a peak position of the envelope signal a.

In such a configuration, also in the present embodiment, the optimal drain voltage can be supplied to the power amplifier 6 in accordance with the peak of the envelope signal, thus enabling improvement in the power efficiency.

Embodiment 4

Next, Embodiment 4 will be described.

Figure 15:
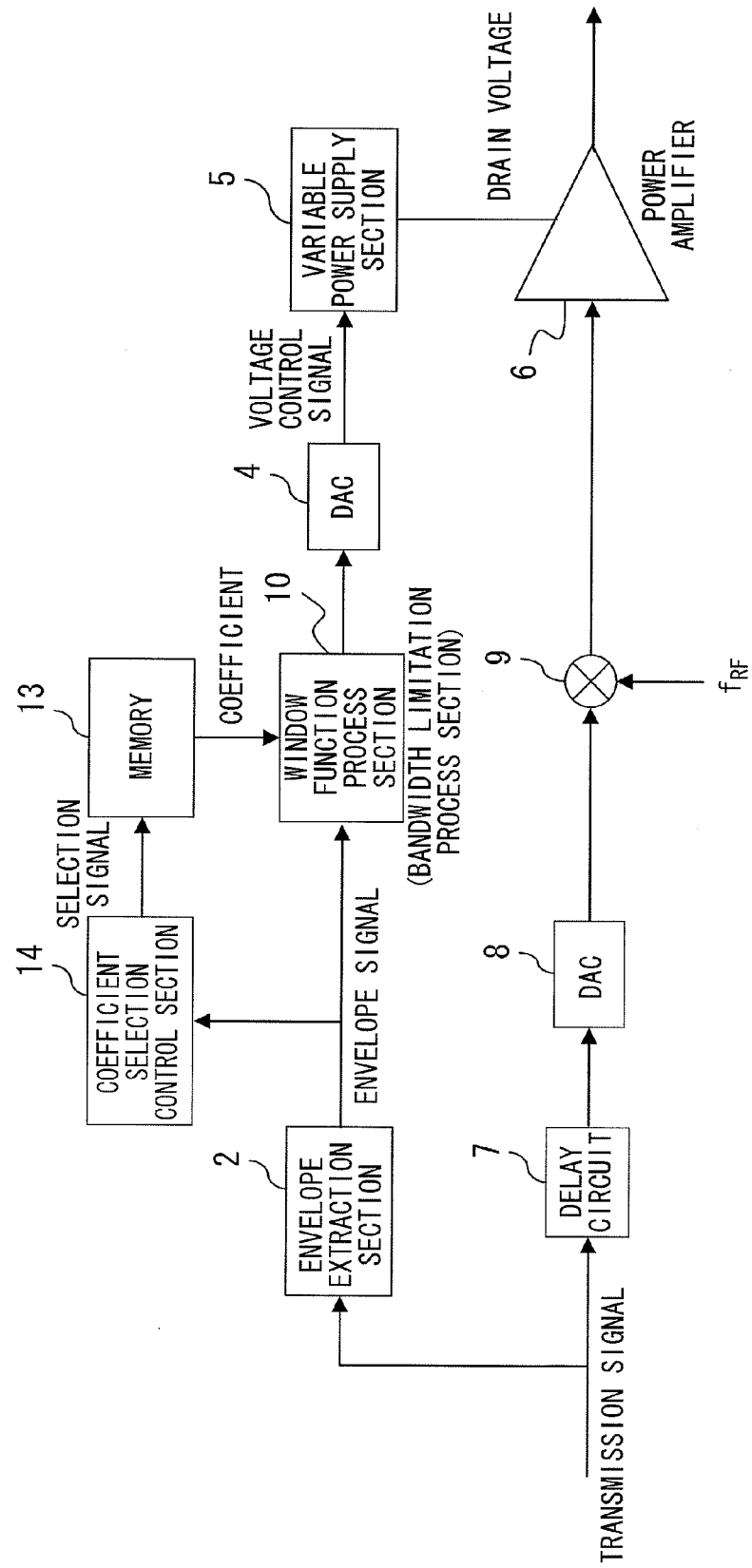
FIG. 15 is a circuit diagram for describing Embodiment 4.

FIG. 15 is a circuit diagram for describing the present embodiment. In particular, in the present embodiment, a coefficient selection control section 14 is connected to select a window function coefficient in accordance with the characteristics of an envelope signal. The circuit configuration illustrated in FIG. 15 is similar to that described above and illustrated in FIG. 10 except for the coefficient selection control section 14.

Figure 16:
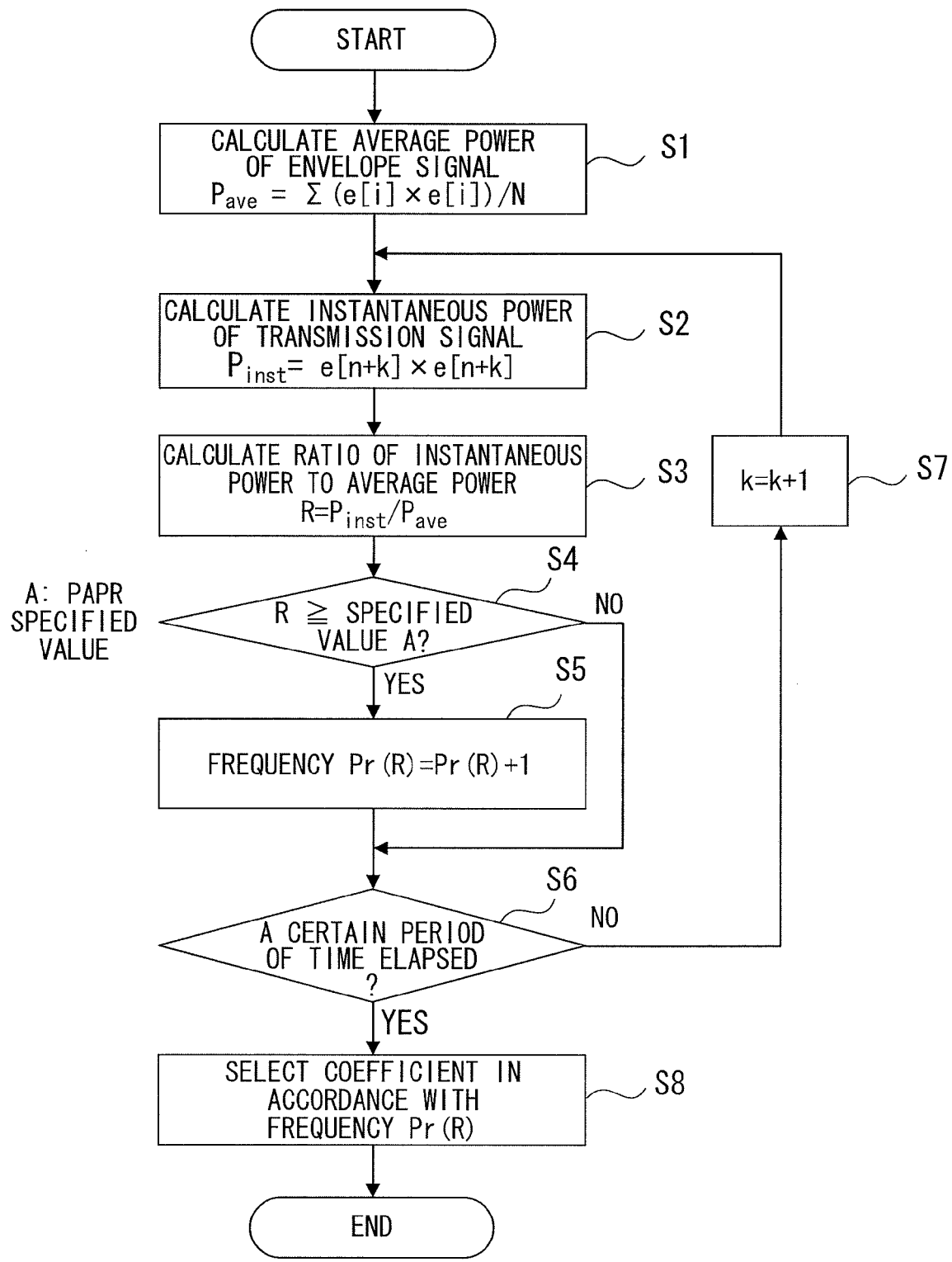
FIG. 16 is a flow chart for describing a window function coefficient selection process performed by a coefficient selection control section.

FIG. 16 is a flow chart for describing a window function coefficient selection process performed by the coefficient selection control section 14. In this embodiment, an envelope signal extracted by the envelope extraction section 2 is inputted to the window function process circuit 10, and is also inputted to the coefficient selection control section 14. In the coefficient selection control section 14, first, an average power of a transmission signal is calculated from the inputted envelope signal (Step (hereinafter, denoted as "S") 1). This average power is calculated based on the following calculation equation: $Pave = \Sigma (e[i] \times e[i])/N$. Then, an instantaneous power of the transmission signal is calculated (S2). This instantaneous power is calculated based on the following calculation equation: $Pinst = e[n+k] \times e[n+k]$. Here, the "i" represents index of $\Sigma$ (i=0 ... N-1), the "N" represents number of the samples for calculating the average power Pave, the "n" represents start time for calculating the instantaneous power Pinst, and the "k" represents an integer equal to or greater then 0.

Next, the ratio R of the instantaneous power to the average power (Pinst/Pave) is calculated (S3). Then, it is determined whether this power ratio R is equal to or greater than a preset threshold value (PAPR value) A (S4), and if the power ratio R is equal to or greater than the threshold value (PAPR value) A (i.e., if the answer is YES in S4), 1 is added to a frequency Pr(R) of the power ratio R equal to or greater than the PAPR value (i.e., the frequency Pr(R) is incremented by 1) (S5).

Subsequently, until a certain period of time has elapsed (while the answer is NO in S6), the above-described process steps are repeated, and a process step of incrementing k→k+1 is repeated (S7, S1 to S6).

Thereafter, after a certain period of time has elapsed (i.e., when the answer is YES in S6), a coefficient is selected in accordance with the frequency Pr(R) on which the adding process has been performed (S8).

FIG. 17 is a diagram illustrating an example of the coefficient selection. A coefficient selection condition table illustrated in FIG. 17 is registered in advance in the coefficient selection control section 14, for example, and a selection is made from coefficients 1 to 3 based on the data of the frequency Pr(R) acquired. For example, when the frequency Pr(R) is smaller than a preset threshold value K1 (i.e., if frequency Pr(R)<K1), the coefficient 1 is selected. Further, when the frequency Pr(R) is equal to or greater than the preset threshold value K1 and is smaller than a threshold value K2 (i.e., if K1≦frequency Pr(R)<K2), the coefficient 2 is selected, and when the frequency Pr(R) is equal to or greater than the preset threshold value K2 (i.e., if K2≦frequency Pr(R)), the coefficient 3 is selected.

Coefficient information selected by the coefficient selection control section 14 in this manner is sent to the memory 13, and the corresponding window function coefficient is read from the memory 13 and set to the window function process circuit 10. The window function process circuit 10 performs a process on the envelope signal by using the acquired window function coefficient, and a drain voltage generated by the variable power supply section 5 is supplied to the power amplifier 6.

Accordingly, in the present embodiment, a window function coefficient can be selected in accordance with the characteristics of the envelope signal, and an optimal drain voltage can be supplied to the power amplifier 6 based on the transmission signal, thus enabling improvement in the power efficiency.

Embodiment 5

Next, Embodiment 5 will be described.

Figure 18:
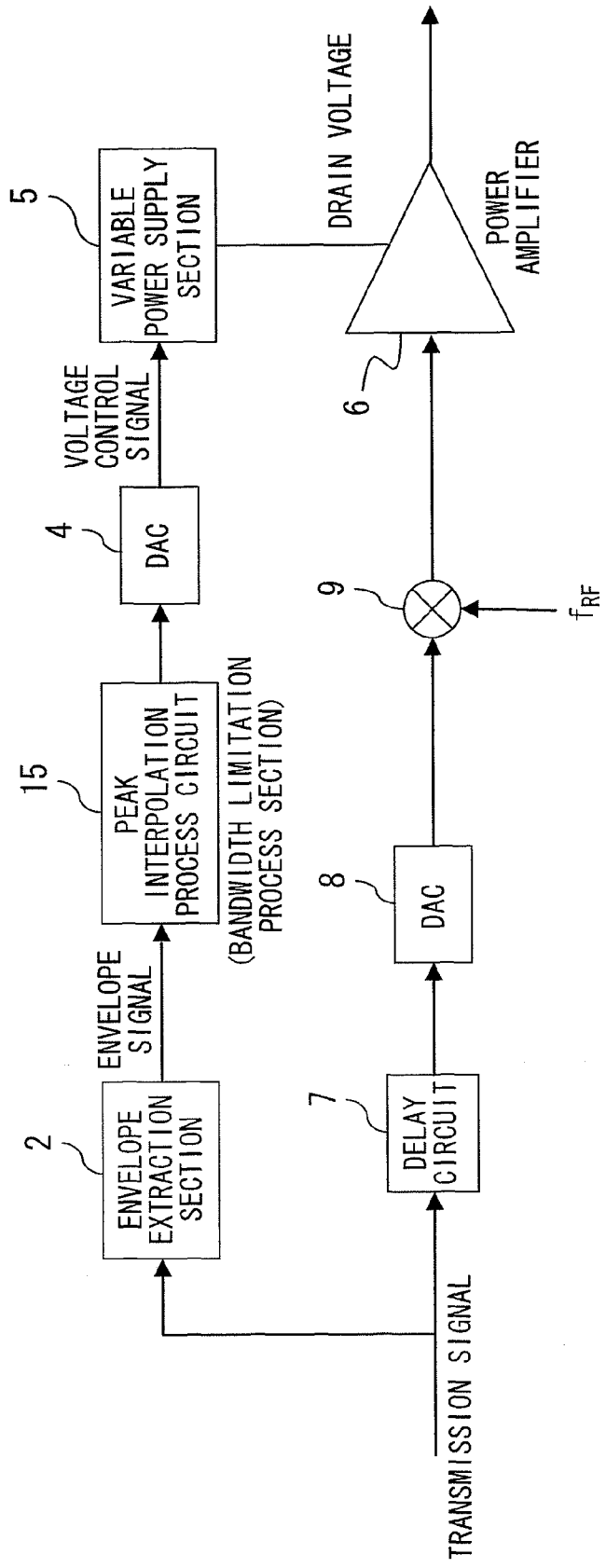
FIG. 18 is a circuit diagram for describing Embodiment 5.

FIG. 18 is a circuit diagram for describing the present embodiment. In particular, in the present embodiment, a peak interpolation process circuit 15 is provided to perform, as a bandwidth limitation process, a peak value interpolation process on an envelope signal. The circuit configuration illustrated in FIG. 18 is similar to that described above and illustrated in FIG. 4 except for the peak interpolation process circuit 15.

Figure 19:
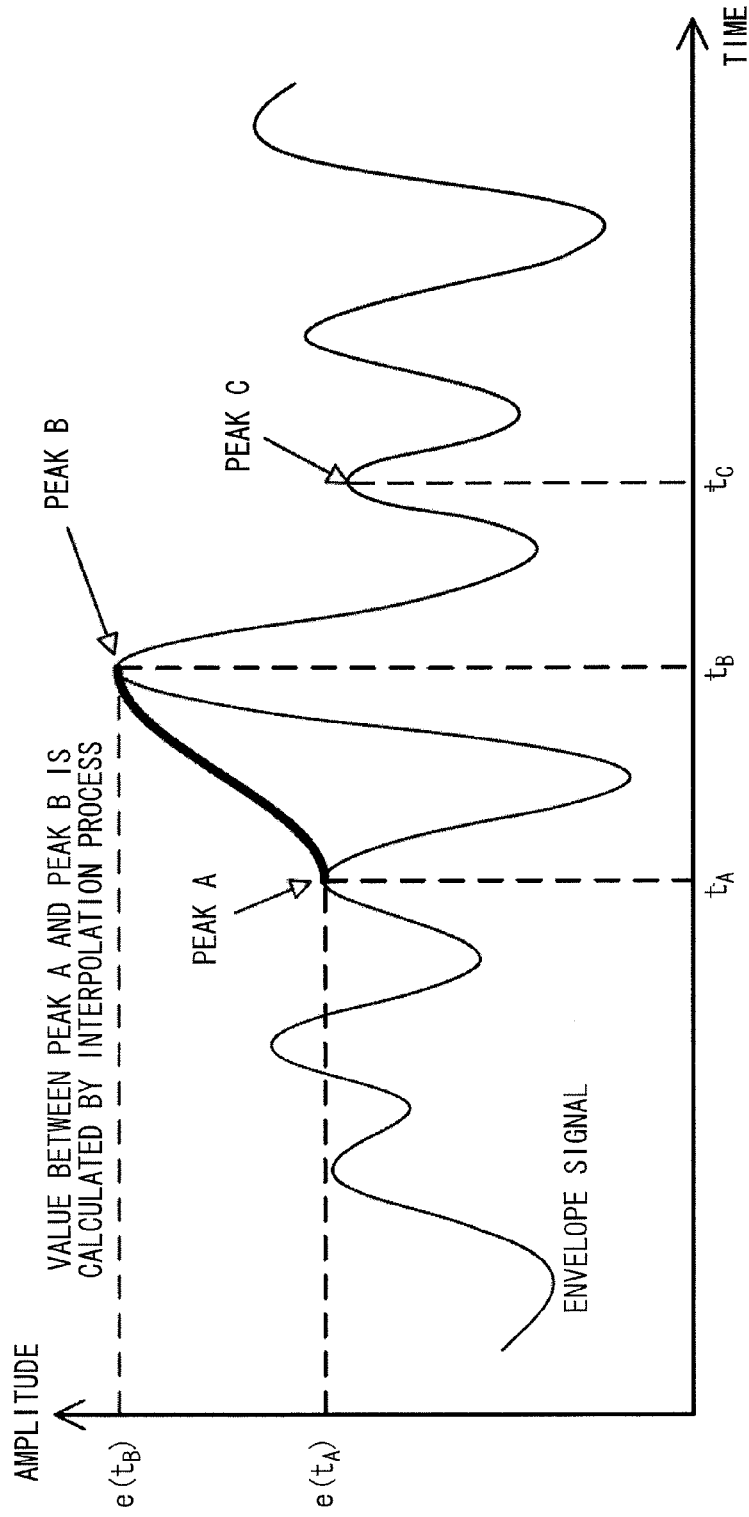
FIG. 19 is a waveform diagram for describing a peak value interpolation process performed by a peak interpolation process section.

FIG. 19 is a waveform diagram for describing a peak value interpolation process performed by the peak interpolation process circuit 15. The peak interpolation process circuit 15 detects a peak of an envelope signal inputted thereto. For example, the peak interpolation process circuit 15 detects peaks A to C, etc. illustrated in FIG. 19. In this embodiment, the timing of detection of the peak A is defined as a time tA, the timing of detection of the peak B is defined as a time tB, and the timing of detection of the peak C is defined as a time tC. The peak interpolation process circuit 15 generates an envelope value between the peak A and the peak B by interpolation calculation. Similarly, an envelope value passing through the next peak B and peak C is generated by interpolation calculation, and subsequent envelope values passing through peak points are sequentially calculated in the similar manner. The interpolation calculation can be carried out by using an approximation method such as linear approximation or spline approximation, for example.

In such a configuration, the peak interpolation process circuit 15 detects the peaks of the envelope signal, and sequentially performs interpolation between the peaks; thus, an output signal passing through the peaks of the envelope signal can be generated, and an optimal drain voltage can be supplied to the power amplifier 6 in accordance with the peaks of the envelope signal, thereby enabling improvement in the power efficiency.

Embodiment 6

Next, Embodiment 6 will be described.

Figure 20:
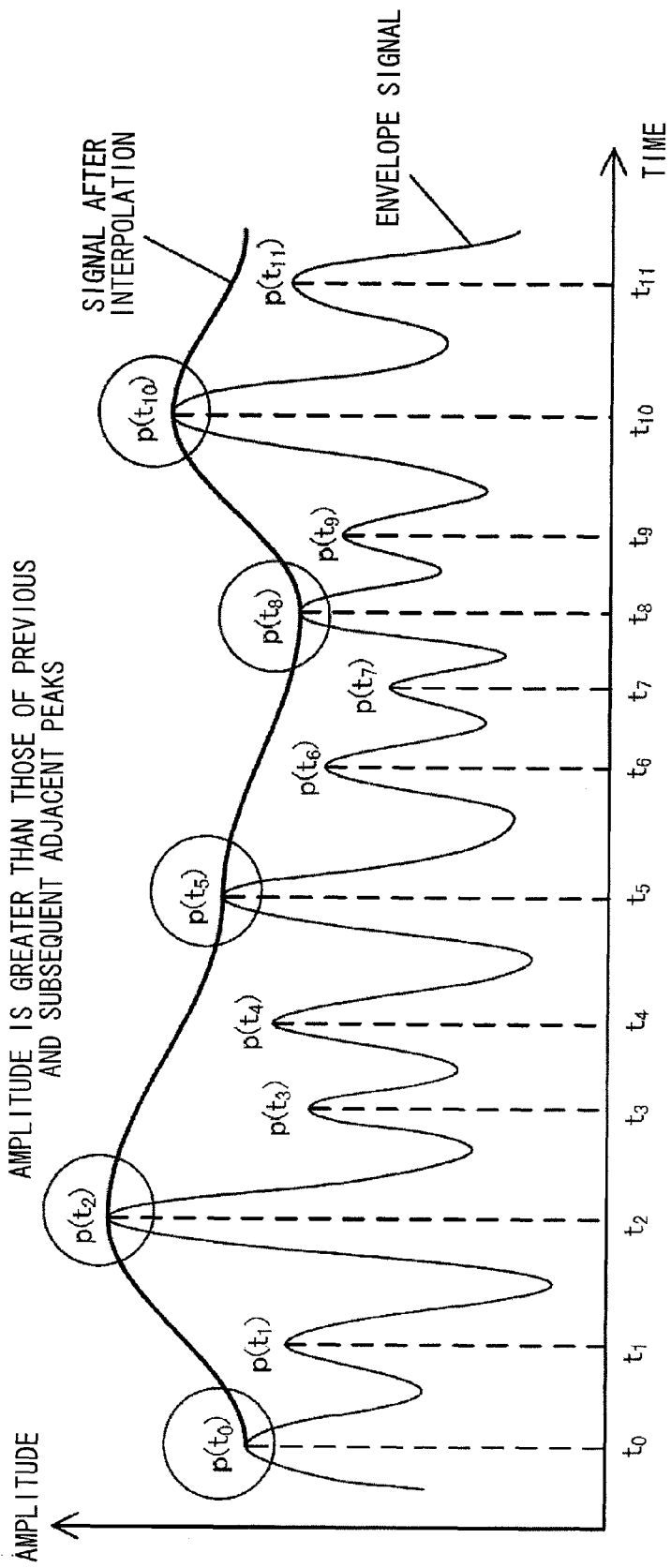
FIG. 20 is a waveform diagram for describing Embodiment 6.

FIG. 20 is a waveform diagram for describing the present embodiment, and illustrates a waveform generated by the peak interpolation process circuit 15. In FIG. 20, peak values of an envelope signal are p (t0), p (t1), ..., and p (t11) at times t0, t1, ..., and t11, respectively.

Figure 21:
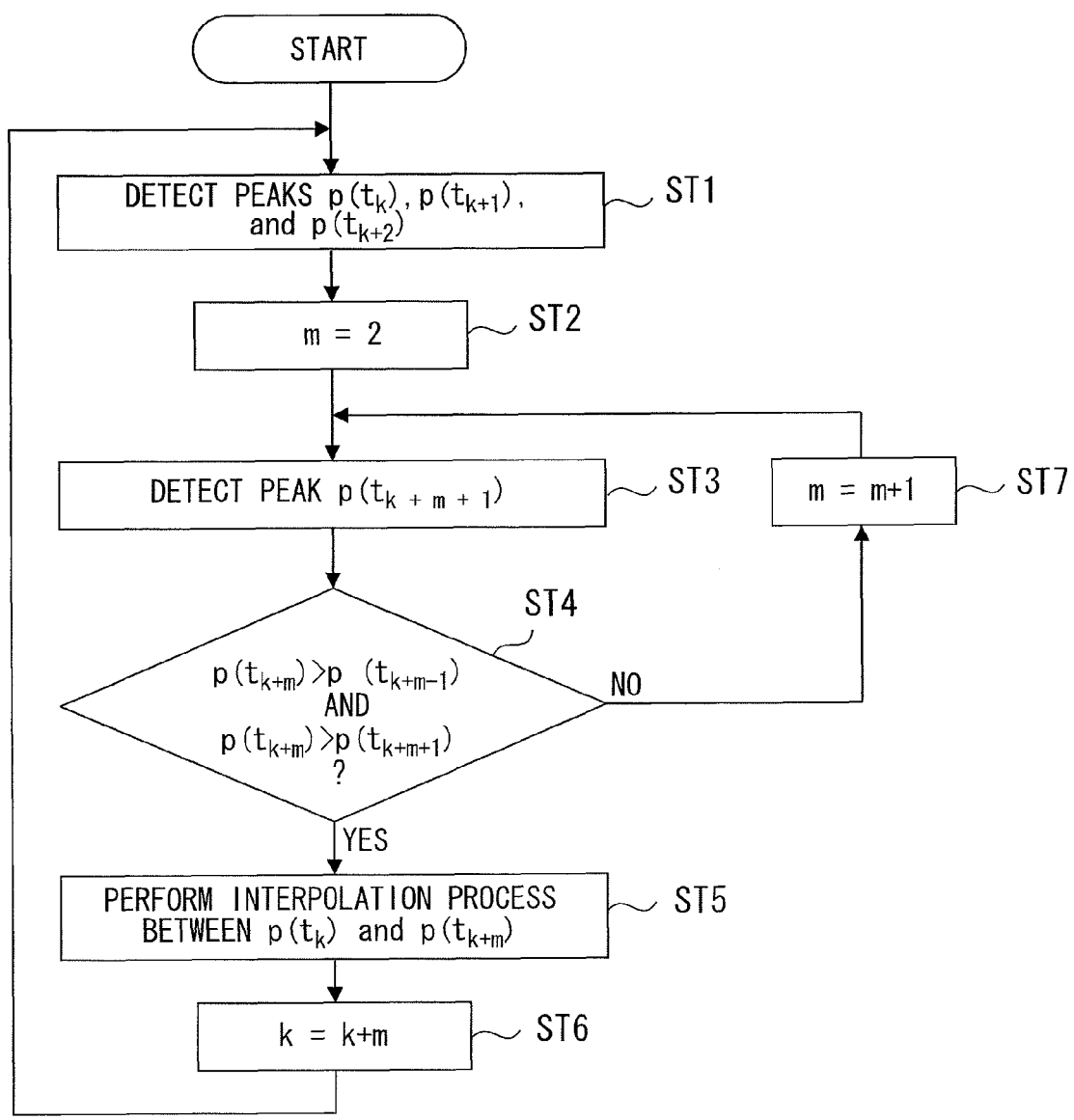
FIG. 21 is a flow chart for describing Embodiment 6.

In the present embodiment, in selecting a peak used for interpolation, a peak whose amplitude is greater than that of each of previous and subsequent adjacent peaks is selected when interpolation is performed between peaks at two points. Hereinafter, the present embodiment will be described with reference to a flow chart illustrated in FIG. 21.

First, as described above, the peak interpolation process circuit 15 detects peak points p (tk), p (tk+1), and p (tk+2) from an envelope signal supplied from the envelope extraction section 2 (Step (hereinafter, denoted as "ST") 1). If an initial value k is 0, peak points p (t0), p (t1) and p (t2) are first detected.

Next, m is set to 1 (ST2). Then, a peak point p (tk+m) is detected (ST3), and it is determined whether this peak point has an amplitude greater than that of each of previous and subsequent adjacent peak points. In other words, it is determined whether the following expressions hold true: peak point p (tk+m)>p (tk+m−1), and p (tk+m)>p (tk+m+1) (ST4). For example, in the case of the peak point p (t2), the following expressions hold true: p (t2)>p (t1), and p (t2)>p (t3). Accordingly, the above-mentioned conditions are met (i.e., the answer is YES in ST4), and an interpolation process is performed between p (t0) and p (t2) (ST5). Then, m is added to the value of k (ST6).

On the other hand, in the case of the next peak point P (t3), since the above-mentioned conditions are not met (i.e., since the answer is NO in ST4), 1 is added to the value of m (ST7), and then it is determined whether the next peak point p (t4) meets the above-mentioned conditions (ST3~4). By performing these process steps, the next peak point, which meets the conditions, is determined as p (t5), and an interpolation process is performed between p (t2) and p (t5) (ST5).

By repeating the above-described process steps, as illustrated in FIG. 20, the peak points p (t2), p (t5), p (t8) and p (t10), each of which is higher than the adjacent peak points, are connected by the interpolation process, and a voltage control signal is generated.

Accordingly, in the present embodiment, a drain voltage is generated based on the voltage control signal generated as described above, and is supplied to the power amplifier 6, thus making it possible to supply the optimal drain voltage to the power amplifier 6 in accordance with the peaks of the envelope signal, and to improve the power efficiency.

Embodiment 7

Next, Embodiment 7 will be described.

Figure 22:
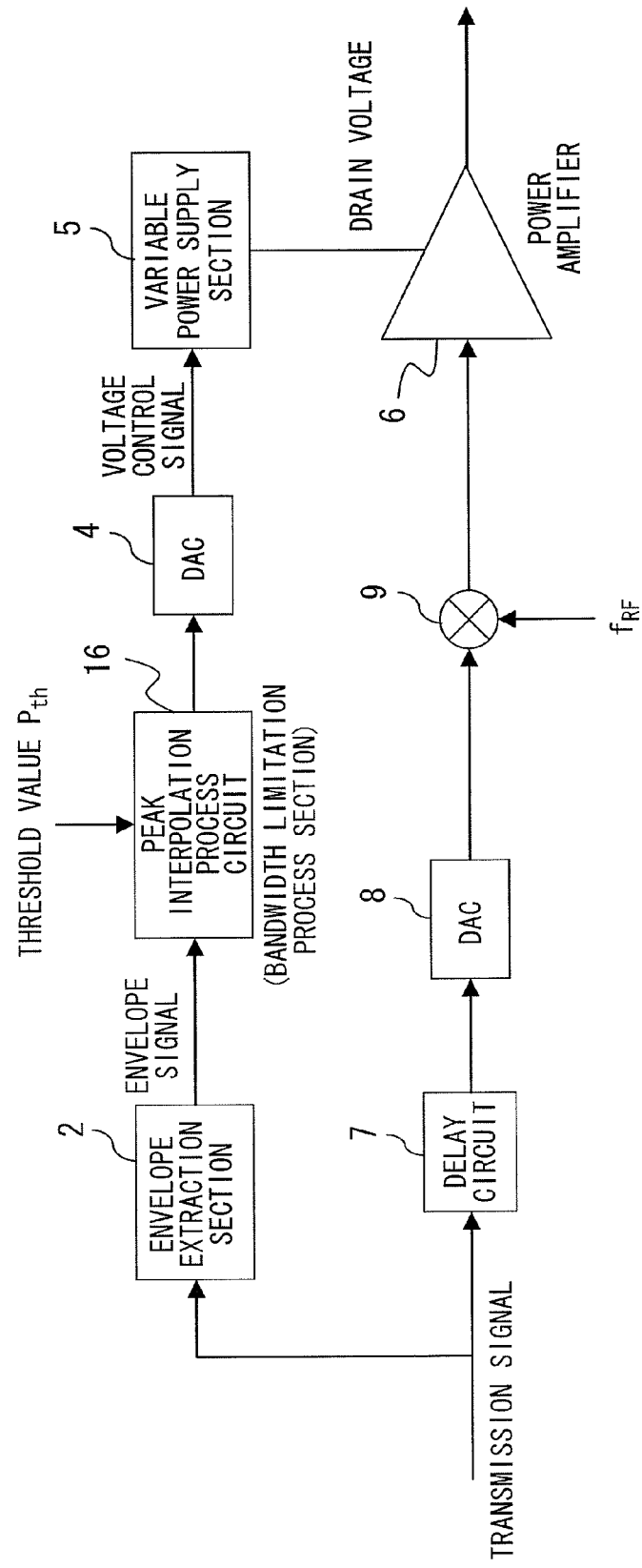
FIG. 22 is a circuit diagram for describing Embodiment 7.

FIG. 22 is a circuit diagram for describing the present embodiment. In particular, in the present embodiment, a peak interpolation process circuit 16 is provided to perform, as a bandwidth limitation process, a peak value interpolation process on an envelope signal. The circuit configuration illustrated in FIG. 22 is similar to that described above and illustrated in FIG. 18 except for the peak interpolation process circuit 16.

Figure 23:
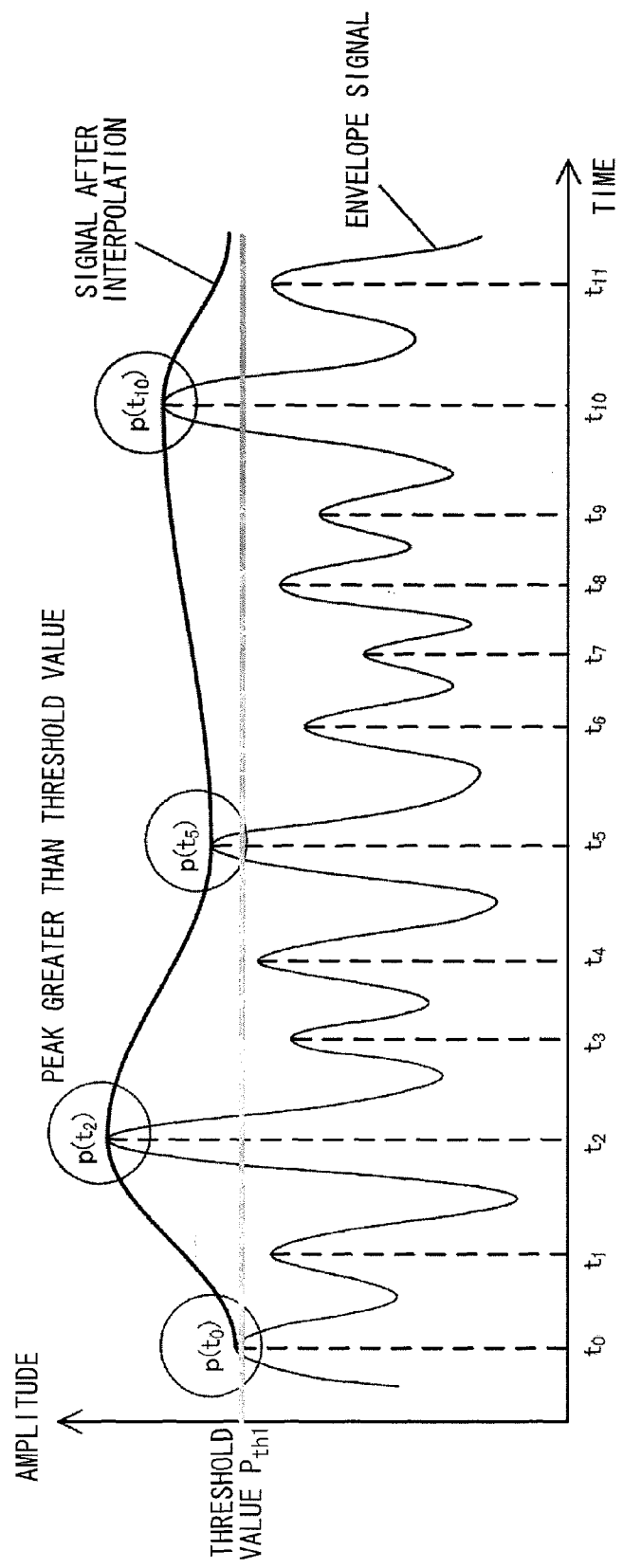
FIG. 23 is a graph for describing an interpolation process performed in the case of using a threshold value Pth.

In the peak interpolation process in the present embodiment, only peaks each having a value greater than a preset threshold value Pth are to be subjected to interpolation. Specifically, as illustrated in FIG. 23, although peaks of an envelope signal are detected at times t0, t1, ..., and t11, only peaks each having a value greater than the threshold value Pth are to be subjected to interpolation, and therefore, an interpolation process for connecting peak points p (t0), p (t2), p (t5) and p (t10) illustrated in FIG. 23 is performed. Hereinafter, the present embodiment will be described with reference to a flow chart.

Figure 24:
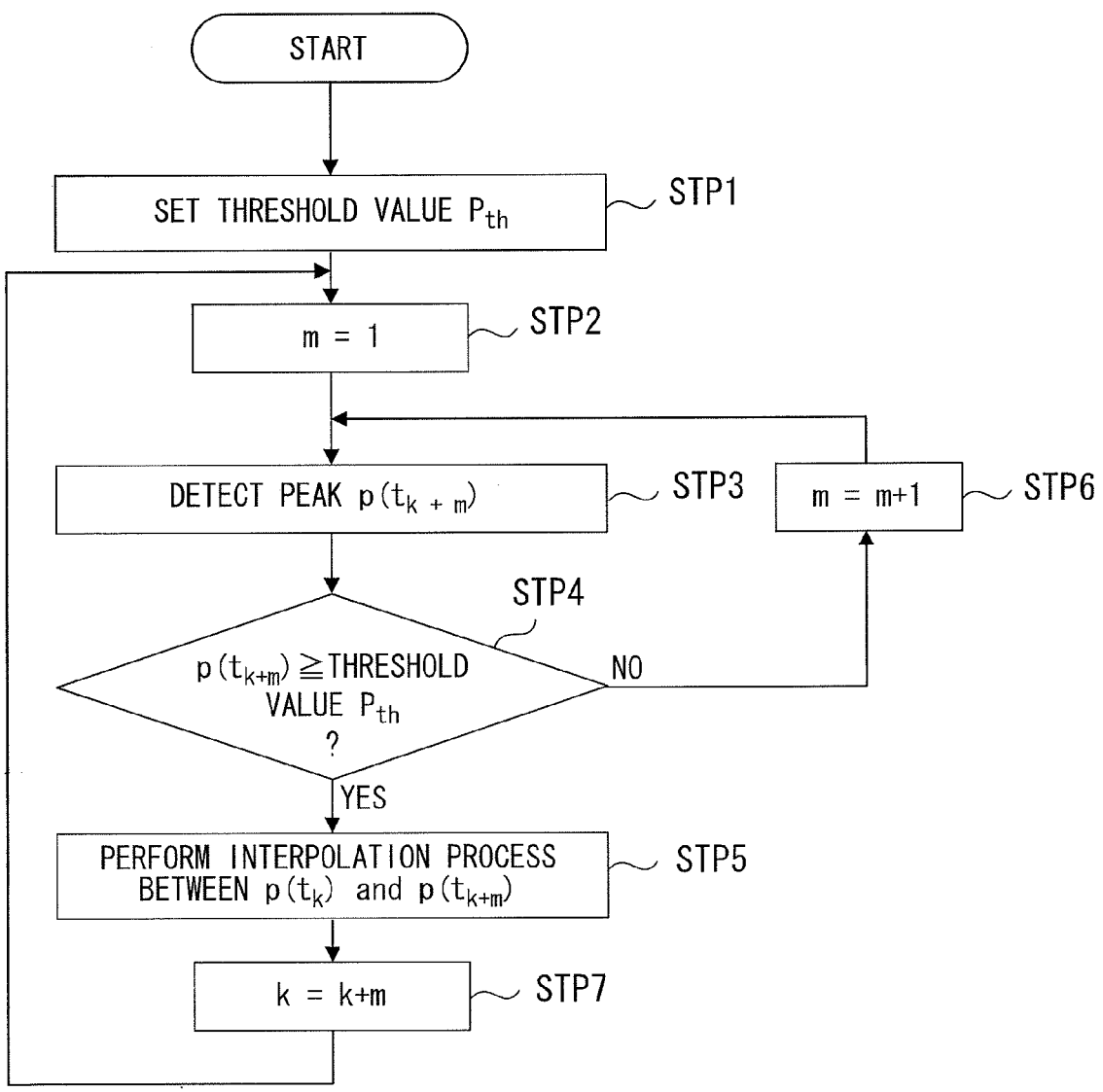
FIG. 24 is a flow chart for describing Embodiment 7.

FIG. 24 is the flow chart for describing the interpolation process performed in the present embodiment. First, the threshold value Pth is set (Step (hereinafter, denoted as "STP") 1). Next, m is set to 1 (STP2), and a peak point. p (tk+m) is detected (STP3). Initially, an initial value of k is set to 0, a peak point p (t1) is detected, and it is determined whether the amplitude of this peak point p (t1) is equal to or greater than the preset threshold value Pth (STP4).

In this embodiment, when the amplitude of the peak point p (t1) is equal to or greater than the preset threshold value Pth (i.e., when the answer is YES in STP4), an interpolation process is performed between p (tk) and p (tk+m) (STP5). However, when the amplitude of the peak point p (t1) is smaller than the preset threshold value Pth (i.e., when the answer is NO in STP4), 1 is added to the value of m (STP6) so that m=2, and the next peak point is detected to make a comparison between the next peak point and the threshold value Pth. In the example illustrated in FIG. 23, since the amplitude of the peak point p (t1) is smaller than the preset threshold value Pth, 1 is added to the value of m so that m=2, and the next peak point is detected.

Since the amplitude of the next peak point p (t2) is greater than the preset threshold value Pth (i.e., since the answer is YES in STP4), an interpolation process is performed between P (t0) and P (t2) (STP5). Further, m is added to the value of k (STP7), and the above-described process steps are repeated.

Accordingly, the next peak point p (t3) is detected, and since the amplitude of the peak point p (t3) is smaller than the preset threshold value Pth (i.e., since the answer is NO in STP 4), 1 is added to the value of m (STP6) so that m=2 to detect the next peak point p (t4), and then the similar process steps are repeated. Due to the above-described process steps, an interpolation process for connecting the peak points p (t0), p (t2), p (t5) and p (t10) illustrated in FIG. 23, for example, is performed.

Figure 25:
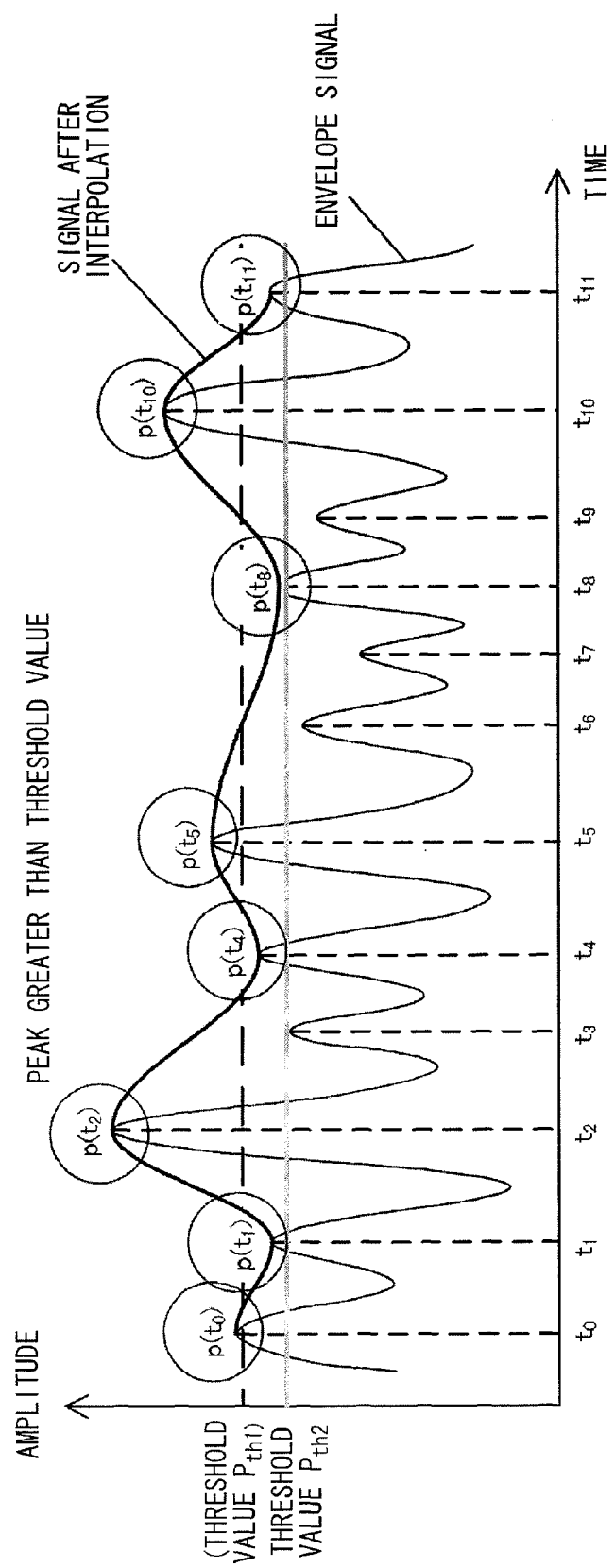
FIG. 25 is a graph for describing an interpolation process performed when the threshold value Pth is decreased.

On the other hand, FIG. 25 illustrates an interpolation process performed when the threshold value Pth is decreased so as to be a threshold value Pth2. In this case, since the level of the threshold value is decreased, a larger number of peak points are to be subjected to interpolation. Accordingly, by changing the threshold value Pth as in the present embodiment, the number of peak points to be subjected to an interpolation process and spacings between the peak points can be changed, and a speed at which a voltage control signal is changed can be flexibly adjusted.

Embodiment 8

Next, Embodiment 8 will be described.

Figure 26:
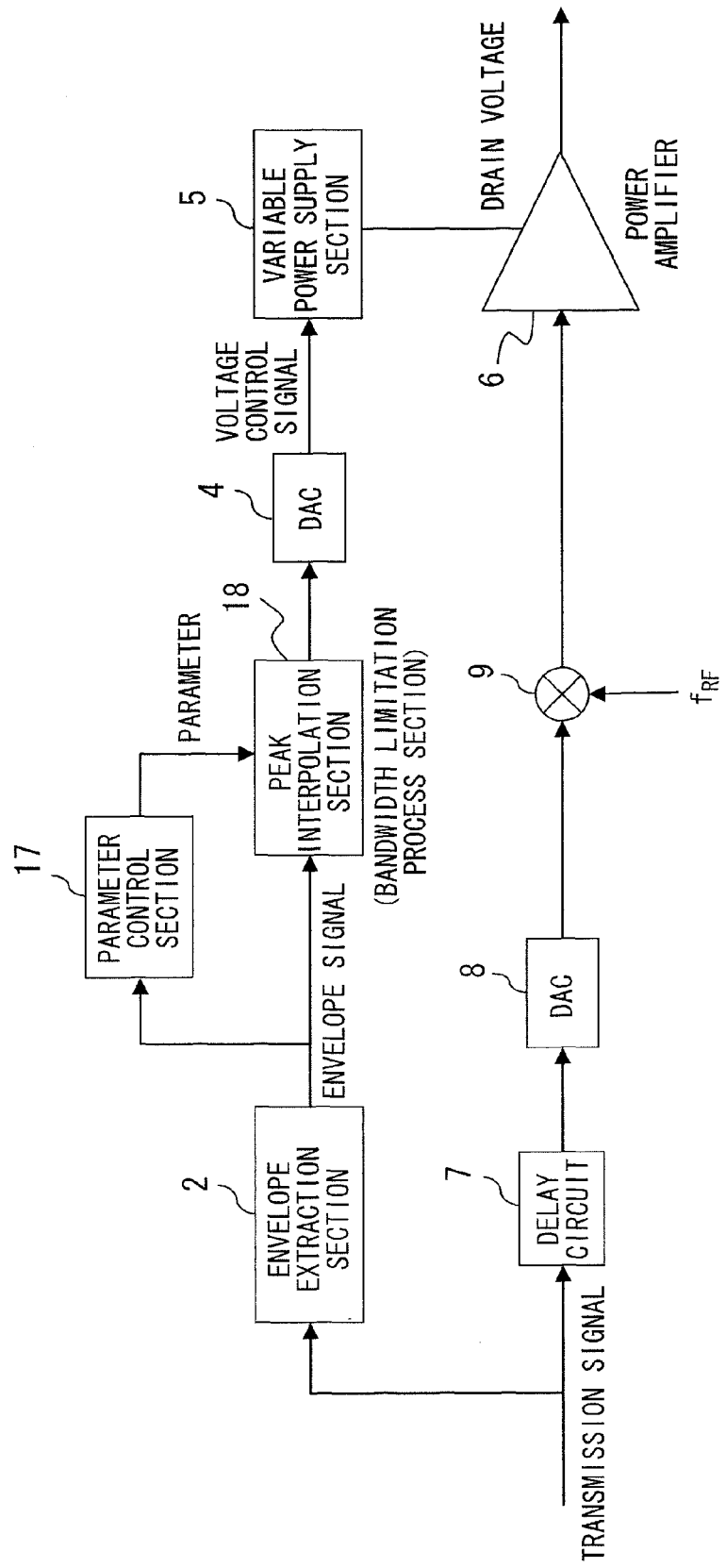
FIG. 26 is a circuit diagram for describing Embodiment 8.

FIG. 26 is a circuit diagram for describing the present embodiment. In particular, in the present embodiment, a parameter control section 17 is connected to a peak interpolation section 18 to select the above-described threshold value Pth in accordance with the characteristics of an envelope signal. The circuit configuration illustrated in FIG. 26 is similar to that described above and illustrated in FIG. 22 except for the parameter control section 17 and the peak interpolation section 18.

Figure 27:
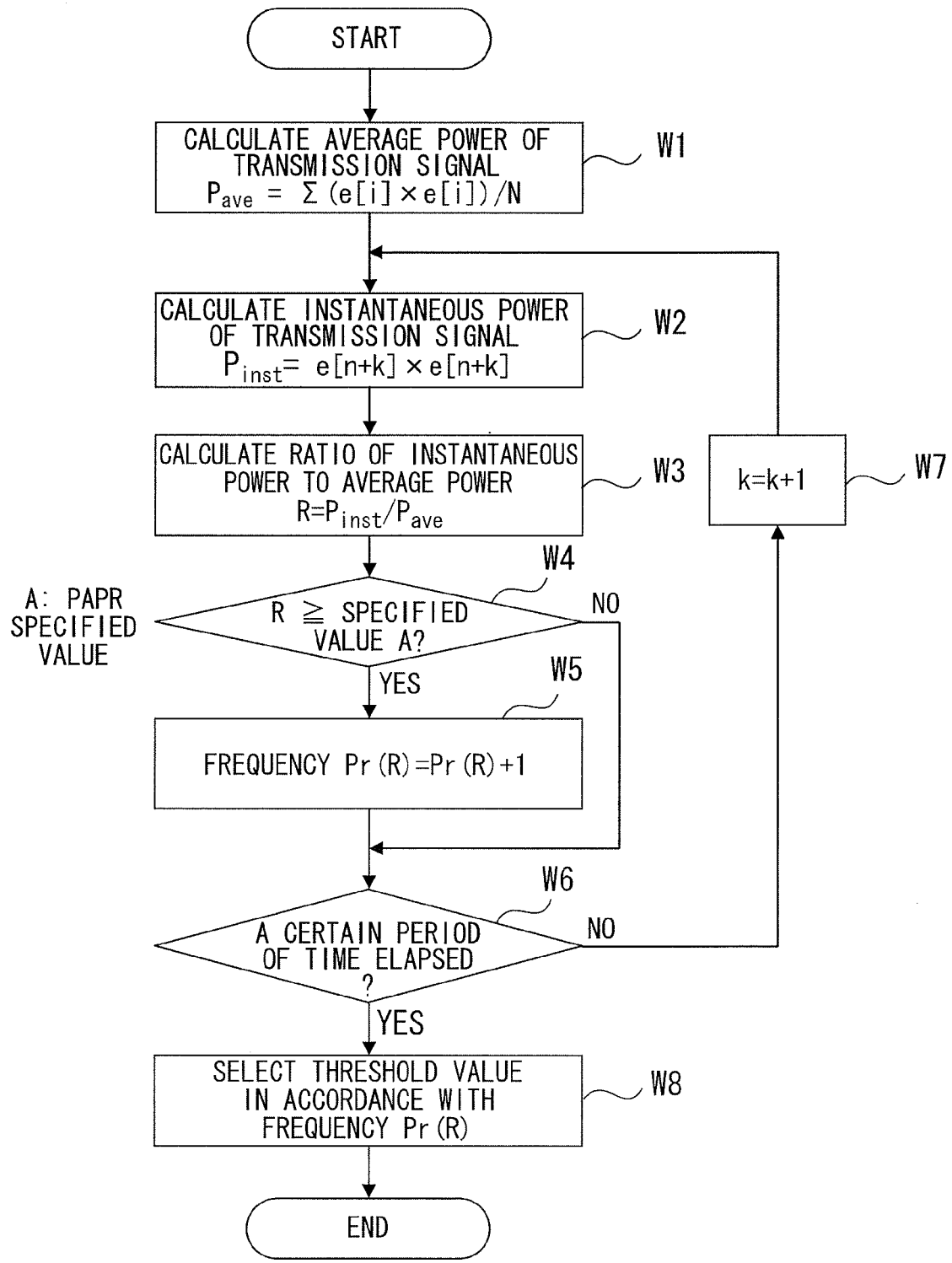
FIG. 27 is a flow chart for describing a process of selecting the threshold value Pth performed by a parameter control section.

FIG. 27 is a flow chart for describing a process of selecting the threshold value Pth performed by the parameter control section 17. In the present embodiment, an envelope signal extracted by the envelope extraction section 2 is inputted to the peak interpolation section 18, and is also inputted to the parameter control section 17. In the parameter control section 17, first, an average power of a transmission signal is calculated from the inputted envelope signal (Step (hereinafter, denoted as "W") 1). This average power is calculated in the same manner as described in Embodiment 4, and is thus calculated based on the following calculation equation: Pave=$\Sigma$ (e [i]×e [i])/N. Then, an instantaneous power of the transmission signal is similarly calculated (W2). This instantaneous power is also calculated in the same manner as described in Embodiment 4, and is thus calculated based on the following calculation equation: Pinst=e [n+k]×e [n+k].

Next, the ratio R of the instantaneous power to the average power (Pinst/Pave) is calculated within a certain period of time (W3), and it is determined whether the power ratio R is equal to or greater than a preset threshold value (PAPR value) A (W4). If the power ratio R is equal to or greater than the threshold value (PAPR value) A (i.e., if the answer is YES in W4), 1 is added to a frequency Pr(R) (W5).

Subsequently, until a certain period of time has elapsed (while the answer is NO in W6), the above-described process steps are repeated, and a process step of incrementing k=k+1 is repeated (W7, W1 to W6).

Thereafter, after a certain period of time has elapsed (i.e., when the answer is YES in W6), the threshold value Pth is selected in accordance with the frequency Pr(R) on which the adding process has been performed (W8). FIG. 28 is a diagram illustrating an example of the threshold value selection. A threshold value selection condition table illustrated in FIG. 28 is registered in advance in the parameter control section 17, for example, and a selection is made from threshold values Pth1 to Pth3 based on information of the frequency Pr(R) acquired. For example, when the frequency Pr(R) is smaller than a preset threshold value K1 (i.e., if frequency Pr(R)<K1), the threshold value Pth1 is selected. Further, when the frequency Pr(R) is equal to or greater than the preset threshold value K1 and is smaller than a threshold value K2 (i.e., if K1$\leq$frequency Pr(R)<K2), the threshold value Pth2 is selected, and when the frequency Pr(R) is equal to or greater than the preset threshold value K2 (i.e., if K2$\leq$frequency Pr(R)), the threshold value Pth3 is selected.

Information of the threshold value Pth selected by the parameter control section 17 in this manner is sent to the peak interpolation section 18, and the peak interpolation section 18 uses the selected threshold value Pth to perform the above-described peak point interpolation process.

Accordingly, in the present embodiment, the threshold value Pth can be selected in accordance with the characteristics of the envelope signal, and an optimal drain voltage can be transmitted to the power amplifier 6 based on the transmission signal, thus enabling improvement in the power efficiency.

As described above, according to Embodiments 1 to 8, when bandwidth limitation is performed based on envelope information of the transmission signal, a voltage control signal is generated in accordance with the peak of the envelope signal, and when the transmission signal is supplied to the power amplifier 6 to perform an amplification process, an optimal voltage can be supplied to the power amplifier 6 in accordance with the peak of the envelope, thereby enabling improvement in the power efficiency.

A supply voltage generated by the variable power supply section 5 based on the voltage control signal sent from the bandwidth limitation process section 3 may be a collector voltage instead of a drain voltage supplied to the power amplifier 6.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

In regard to Embodiments 1 to 8 described above, the following additional descriptions are disclosed.

Additional Description 1

A power amplifying apparatus comprising: a bandwidth limitation process circuit to which an envelope signal included in a transmission signal is inputted, and which performs a bandwidth limitation process on the envelope signal; a variable power supply circuit for generating a power amplifier supply voltage based on a voltage control signal generated by the bandwidth limitation process circuit; and a power amplifier which is fed an input signal, and which is driven in accordance with the supply voltage from the variable power supply circuit.

Additional Description 2

The power amplifying apparatus according to Additional Description 1, wherein the bandwidth limitation process circuit for performing a bandwidth limitation process is a circuit that uses a window function.

Additional Description 3

The power amplifying apparatus according to Additional Description 1, wherein the bandwidth limitation process circuit selects a coefficient from a plurality of window function coefficients to generate the voltage control signal.

Additional Description 4

The power amplifying apparatus according to Additional Description 3, wherein the plurality of window function coefficients are stored in advance in a storage circuit, and are selected and supplied to the bandwidth limitation process circuit.

Additional Description 5

The power amplifying apparatus according to Additional Description 3 or 4, wherein the selection made from the plurality of window function coefficients is performed in accordance with a characteristic of the envelope signal.

Additional Description 6

The power amplifying apparatus according to Additional Description 5, wherein the characteristic of the envelope signal is a number of times that a power ratio, calculated as the power ratio of an instantaneous power to an average power of the envelope signal, is equal to or greater than a predetermined threshold value, and the window function coefficient is selected in accordance with the number of times.

Additional Description 7

The power amplifying apparatus according to Additional Description 1, wherein the bandwidth limitation process circuit detects peak values of the envelope signal, and performs an interpolation process between the peak values, thereby generating the voltage control signal.

Additional Description 8

The power amplifying apparatus according to Additional Description 7, wherein the bandwidth limitation process circuit detects peak values of the envelope signal, and further selects, from among the peak values, a peak value equal to or greater than both adjacent peak values to perform an interpolation process.

Additional Description 9

The power amplifying apparatus according to Additional Description 7, wherein the bandwidth limitation process circuit detects peak values of the envelope signal, and extracts, from among the peak values, a peak value equal to or greater than a preset threshold value to perform an interpolation process between the peak values.

Additional Description 10

The power amplifying apparatus according to Additional Description 9, wherein the threshold value is set in accordance with a characteristic of the transmission signal.

Additional Description 11

The power amplifying apparatus according to Additional Description 10, wherein a power ratio of an instantaneous power to an average power of the envelope signal is calculated, and the threshold value set in accordance with the characteristic of the transmission signal is set in accordance with the number of times the power ratio is equal to or greater than a predetermined value.

Additional Description 12

A power amplifier supply voltage control method for controlling a voltage supplied to a power amplifier in accordance with an envelope variation of a transmission signal, wherein when a voltage control signal supplied to the power amplifier is generated from an envelope signal generated based on the transmission signal, a bandwidth limitation process for making a peak point of the voltage control signal coincide with a peak point of the envelope signal is performed.

Additional Description 13

The power amplifier supply voltage control method according to Additional Description 12, wherein a window function is used for the bandwidth limitation process.

The invention claimed is:

1. A power amplifying apparatus comprising:
   a bandwidth limitation process circuit that performs a bandwidth limitation process for generating a voltage control signal having a peak point that is coincident with a peak point of an envelope signal, the bandwidth limitation process circuit comprising:
      a plurality of circuits to each of which the envelope signal included in a transmission signal is inputted in synchronization with a clock signal, and each of which outputs each of a plurality of signals corresponding to the envelope signal in different timing,
      a plurality of multiplying circuits each of which multiplies an output of each of the plurality of circuits by each of a plurality of window function coefficients, and
      a selection circuit that selects a maximum value from among multiplying results of the plurality of multiplying circuits, the maximum value being converted to the voltage control signal;
   a variable power supply circuit for generating a power amplifier supply voltage based on the voltage control signal; and
   a power amplifier which is fed an input signal, and which is driven in accordance with the power amplifier supply voltage.

2. The power amplifying apparatus according to claim 1, wherein the bandwidth limitation process circuit for performing the bandwidth limitation process is a circuit that uses a window function.

3. The power amplifying apparatus according to claim 1, wherein the bandwidth limitation process circuit selects a coefficient from the plurality of window function coefficients to generate the voltage control signal.

4. The power amplifying apparatus according to claim 3, wherein the plurality of window function coefficients are stored in advance in a storage circuit, and are selected and supplied to the bandwidth limitation process circuit.

5. The power amplifying apparatus according to claim 3, wherein the selection made from the plurality of window function coefficients is performed in accordance with a characteristic of the envelope signal.

6. The power amplifying apparatus according to claim 5, wherein the characteristic of the envelope signal is a number of times that a power ratio, calculated as a ratio of an instantaneous power to an average power of the envelope signal, is equal to or greater than a predetermined threshold value, and the plurality of window function coefficients are selected in accordance with the number of times.

7. The power amplifying apparatus according to claim 1, wherein the bandwidth limitation process circuit detects peak values of the envelope signal, and performs an interpolation process between the peak values, thereby generating the voltage control signal.

8. The power amplifying apparatus according to claim 7, wherein the bandwidth limitation process circuit detects the peak values of the envelope signal, and further selects, from among the peak values, a peak value equal to or greater than both adjacent peak values to perform the interpolation process.

9. The power amplifying apparatus according to claim 7, wherein the bandwidth limitation process circuit detects the peak values of the envelope signal, and extracts, from among the peak values, a peak value equal to or greater than a preset threshold value to perform the interpolation process between the peak values.

10. The power amplifying apparatus according to claim 9, wherein the preset threshold value is set in accordance with a characteristic of the transmission signal.

11. The power amplifying apparatus according to claim 10, wherein a power ratio of an instantaneous power to an average power of the envelope signal is calculated, and the preset threshold value set in accordance with the characteristic of the transmission signal is set in accordance with a number of times the power ratio is equal to or greater than a predetermined value.

12. A power amplifier supply voltage control method, comprising:
    extracting an envelope signal from a transmission signal;
    performing a bandwidth limitation process for generating a voltage control signal having a peak point that is coincident with a peak point of the envelope signal, the bandwidth limitation process comprising:
       inputting the extracted envelope signal into a plurality of circuits in synchronization with a clock signal, each of the plurality of circuits outputting each of a plurality of signals corresponding to the envelope signal in different timing,
       multiplying each output of the plurality of circuits by each of a plurality of window function coefficients, and
       selecting a maximum value from among results of the multiplying, the maximum value being converted to the voltage control signal; and
    supplying the voltage control signal to the power amplifier.

13. The power amplifier supply voltage control method according to claim 12, wherein a window function is used for the bandwidth limitation process.

* * * * *